US012648170B2

(12) United States Patent
Lin et al.

(10) Patent No.: US 12,648,170 B2
(45) Date of Patent: Jun. 2, 2026

(54) FIELD EFFECT TRANSISTOR FOR REDUCING HOT CARRIER DAMAGE AND METHODS FOR FORMING THE SAME

(71) Applicant: Taiwan Semiconductor Manufacturing Company Limited, Hsinchu (TW)

(72) Inventors: Hsin Fu Lin, Hsinchu (TW); Shiang-Hung Huang, New Taipei City (TW); Pei-Shan Hsieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 448 days.

(21) Appl. No.: 18/324,238

(22) Filed: May 26, 2023

(65) Prior Publication Data

US 2024/0274716 A1     Aug. 15, 2024

Related U.S. Application Data

(60) Provisional application No. 63/445,708, filed on Feb. 14, 2023.

(51) Int. Cl.
*H10D 30/62*       (2025.01)
*H10D 30/01*       (2025.01)
(Continued)

(52) U.S. Cl.
CPC ......... *H10D 30/62* (2025.01); *H10D 30/0241* (2025.01); *H10D 30/0285* (2025.01);
(Continued)

(58) Field of Classification Search
CPC ............... H10D 30/62; H10D 30/0241; H10D 30/0285; H10D 62/115; H10D 62/153;
(Continued)

(56) References Cited

U.S. PATENT DOCUMENTS

| 2017/0179279 A1 | 6/2017 | Lin et al. |
| 2017/0243950 A1 | 8/2017 | Liu et al. |

(Continued)

FOREIGN PATENT DOCUMENTS

| TW | 200913281 A | 3/2009 |
| TW | 202002299 A | 1/2020 |
| TW | 202236395 A | 9/2022 |

OTHER PUBLICATIONS

Korean Patent and Trademark Office; KR Application No. 10-2024-0020217; Office Action of Nov. 11, 2024; 10 pages.

(Continued)

*Primary Examiner* — Mohammad A Rahman
(74) *Attorney, Agent, or Firm* — The Marbury Law Group, PLLC

(57) ABSTRACT
A field effect transistor includes a source-side doped well, a drift-region well, a source region, a drain region; a shallow trench isolation structure including a first portion overlying the drift-region well and laterally spaced from the source-side doped well; a gate dielectric layer; a gate electrode overlying the gate dielectric layer; and a proximal doped layer stack embedded within the drift-region well and interposed between the source-side doped well and the first portion of the shallow trench isolation structure. Proximal doped semiconductor layers of the proximal doped layer stack have different average atomic concentrations of dopants of the second conductivity type.

20 Claims, 27 Drawing Sheets

(51) Int. Cl.

| | |
|---|---|
| *H10D 62/10* | (2025.01) |
| *H10D 62/13* | (2025.01) |
| *H10D 62/17* | (2025.01) |
| *H10D 64/27* | (2025.01) |
| *H10P 30/20* | (2026.01) |

(52) U.S. Cl.
CPC ......... *H10D 62/115* (2025.01); *H10D 62/153* (2025.01); *H10D 62/299* (2025.01); *H10D 64/516* (2025.01); *H10P 30/204* (2026.01); *H10P 30/208* (2026.01)

(58) Field of Classification Search
CPC ............... H10D 62/299; H10D 64/516; H10D 30/0221; H10D 30/603; H10D 30/65; H10D 62/116; H10D 30/6715; H10D 62/106; H01L 21/26506
See application file for complete search history.

(56) References Cited

U.S. PATENT DOCUMENTS

| | | | |
|---|---|---|---|
| 2019/0378924 A1 | 12/2019 | Huang et al. | |
| 2020/0020706 A1 | 1/2020 | Chen et al. | |
| 2022/0293729 A1* | 9/2022 | Lin ...................... | H10D 30/657 |

OTHER PUBLICATIONS

Jianq Chyun Intellectual Property Office; TW Application No. 112127135; Office Action of Feb. 7, 2024; 10 pages.

* cited by examiner

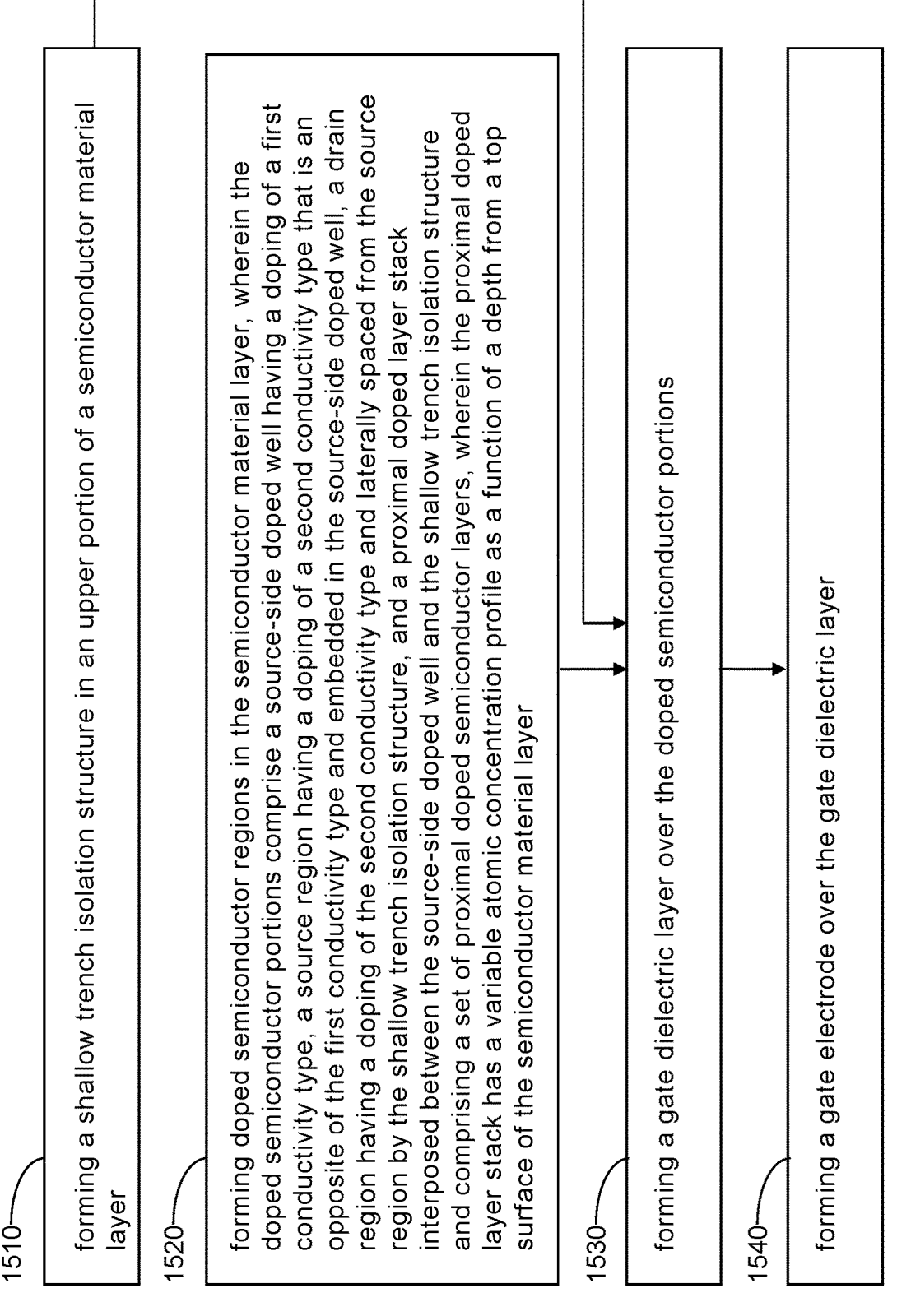

1510 — forming a shallow trench isolation structure in an upper portion of a semiconductor material layer 1520 — forming doped semiconductor regions in the semiconductor material layer, wherein the doped semiconductor portions comprise a source-side doped well having a doping of a first conductivity type, a source region having a doping of a second conductivity type that is an opposite of the first conductivity type and embedded in the source-side doped well, a drain region having a doping of the second conductivity type and laterally spaced from the source region by the shallow trench isolation structure, and a proximal doped layer stack interposed between the source-side doped well and the shallow trench isolation structure and comprising a set of proximal doped semiconductor layers, wherein the proximal doped layer stack has a variable atomic concentration profile as a function of a depth from a top surface of the semiconductor material layer 1530 — forming a gate dielectric layer over the doped semiconductor portions 1540 — forming a gate electrode over the gate dielectric layer

FIG. 15

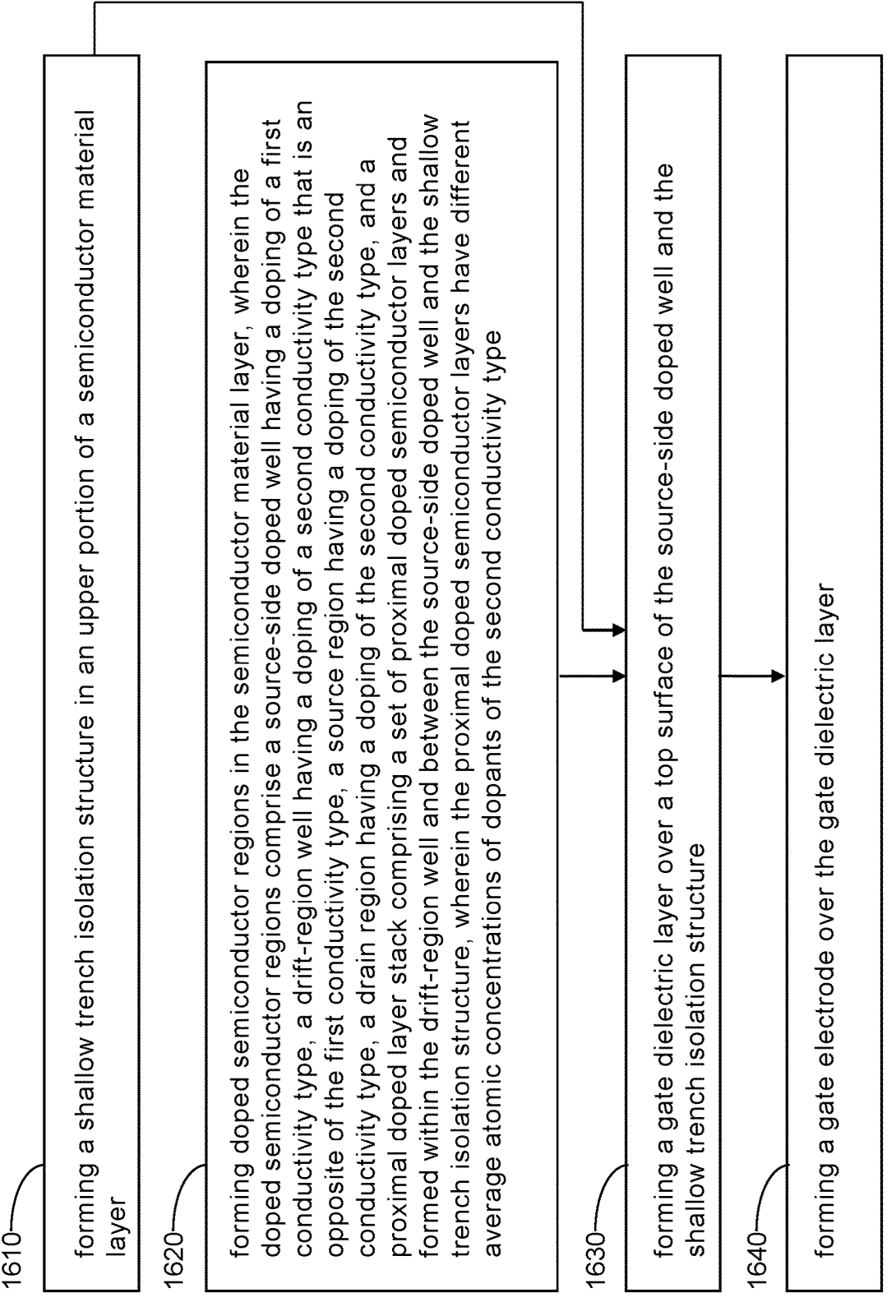

1610 — forming a shallow trench isolation structure in an upper portion of a semiconductor material layer 1620 — forming doped semiconductor regions in the semiconductor material layer, wherein the doped semiconductor regions comprise a source-side doped well having a doping of a first conductivity type, a drift-region well having a doping of a second conductivity type that is an opposite of the first conductivity type, a source region having a doping of the second conductivity type, a drain region having a doping of the second conductivity type, and a proximal doped layer stack comprising a set of proximal doped semiconductor layers and formed within the drift-region well and between the source-side doped well and the shallow trench isolation structure, wherein the proximal doped semiconductor layers have different average atomic concentrations of dopants of the second conductivity type 1630 — forming a gate dielectric layer over a top surface of the source-side doped well and the shallow trench isolation structure 1640 — forming a gate electrode over the gate dielectric layer

FIG. 16

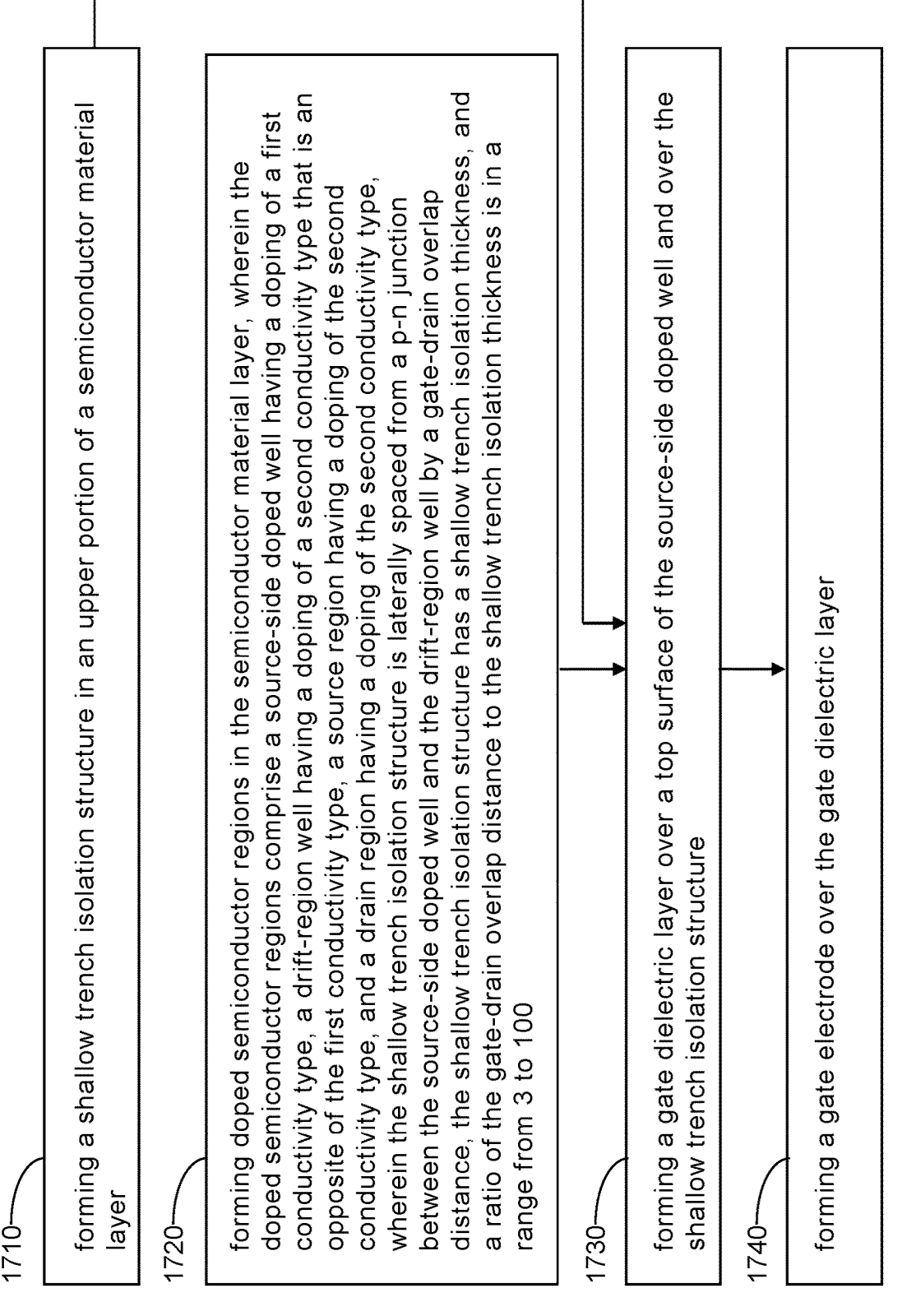

1710 — forming a shallow trench isolation structure in an upper portion of a semiconductor material layer 1720 — forming doped semiconductor regions in the semiconductor material layer, wherein the doped semiconductor regions comprise a source-side doped well having a doping of a first conductivity type, a drift-region well having a doping of a second conductivity type that is an opposite of the first conductivity type, a source region having a doping of the second conductivity type, and a drain region having a doping of the second conductivity type, wherein the shallow trench isolation structure is laterally spaced from a p-n junction between the source-side doped well and the drift-region well by a gate-drain overlap distance, the shallow trench isolation structure has a shallow trench isolation thickness, and a ratio of the gate-drain overlap distance to the shallow trench isolation thickness is in a range from 3 to 100

1730 — forming a gate dielectric layer over a top surface of the source-side doped well and over the shallow trench isolation structure 1740 — forming a gate electrode over the gate dielectric layer

FIG. 17

FIELD EFFECT TRANSISTOR FOR REDUCING HOT CARRIER DAMAGE AND METHODS FOR FORMING THE SAME

RELATED APPLICATIONS

This application claims the benefit of priority from U.S. Provisional Application No. 63/445,708, entitled "Way of Enhancing Hot Carrier Immunity in Power Devices," filed on Feb. 14, 2023, the entire contents of which is incorporated herein by reference for all purposes.

BACKGROUND

High voltage field effect transistors are used as power devices that provide high switching power. Breakdown of high voltage field effect transistors may occur through hot carrier-induced damage on the drain side of a gate dielectric layer. Thus, reduction of hot carrier-induced damage to the gate dielectric layer is desirable in order to provide high reliability and long operational life of the high voltage field effect transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 is a first flow chart illustrating a general sequence of processing steps that may be used to form a high voltage field effect transistor of the present disclosure.

FIG. 16 is a second flow chart illustrating a general sequence of processing steps that may be used to form a high voltage field effect transistor of the present disclosure.

FIG. 17 is a third flow chart illustrating a general sequence of processing steps that may be used to form a high voltage field effect transistor of the present disclosure.

DETAILED DESCRIPTION

Figure 1:
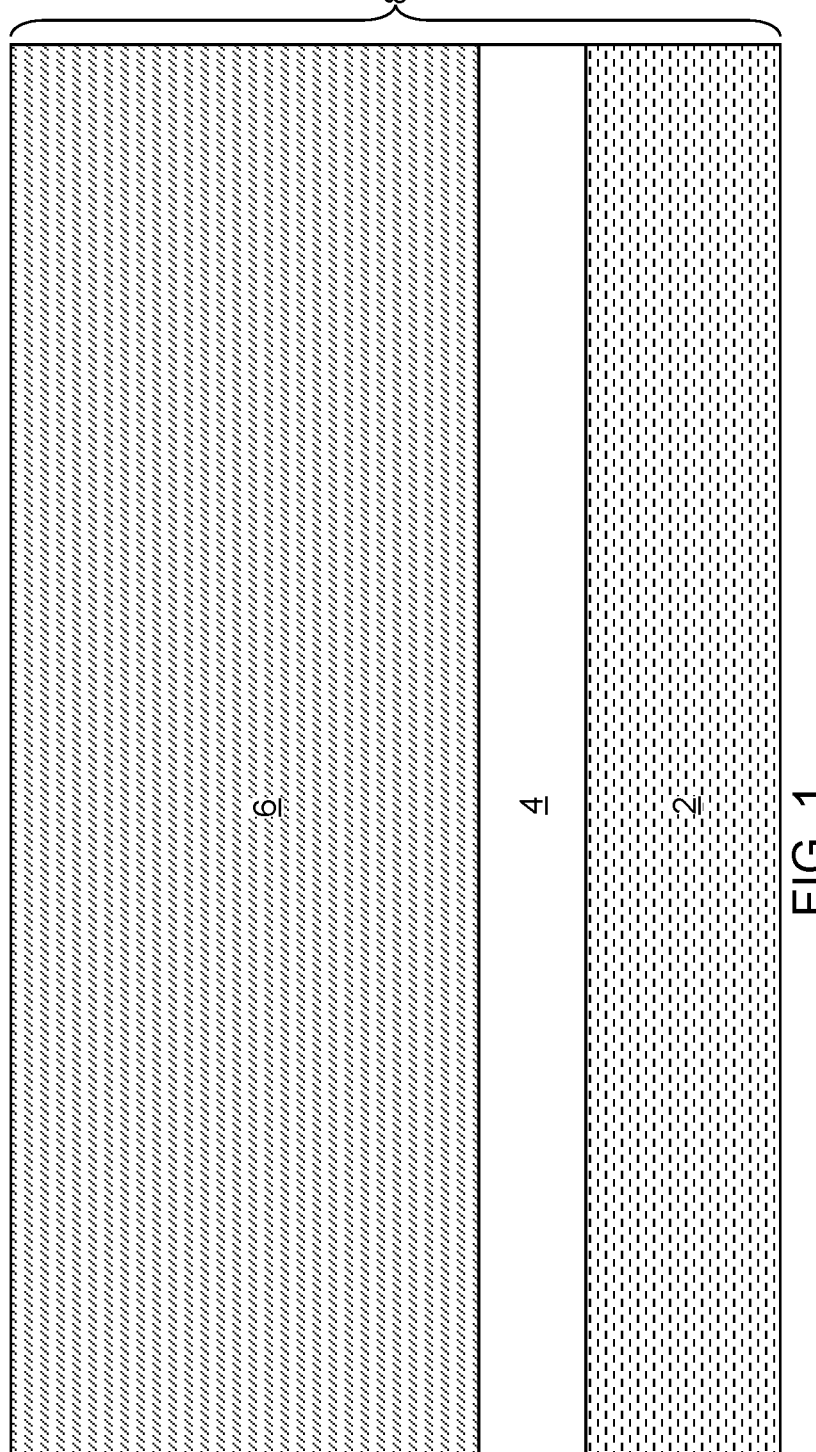
FIG. 1 is a vertical cross-sectional view of an intermediate structure prior to formation of doped wells according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise. Embodiments of the present disclosure are directed to a field effect transistor including a downward-protruding gate electrode and methods for forming the same, the various aspects of which are now described in detail.

As used herein, a "field effect transistor" refers to any semiconductor device having a semiconductor channel through which electrical current flows with a current density modulated by an external electrical field. As used herein, a "channel region" refers to a semiconductor region in which, mobility of charge carriers may be affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to either or both of a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" may also refer to a source extension region or a drain extension region.

Embodiments of the present disclosure provide high voltage field effect transistors that provide enhanced hot carrier injection (HCI) immunity in power device applications, and methods for forming the same. Embodiments of the present disclosure may be used to provide lateral diffused metal-oxide-semiconductor (LDMOS) field effect transistors using a shallow trench isolation (STI) structure and/or doped semiconductor layer stacks for directing electrical current in a manner that enhances HCI immunity.

A conventional STI structure in a high voltage field effect transistor suffers from severe HCI stress due to impact ionization at a bottom corner of the STI structure, which leads to device degradation over time. An embodiment of the present disclosure reduces device degradation due to HCI structure by setting a ratio of a lateral dimension of a surface portion of a drift-region well to a thickness of an STI structure in a manner that avoids collision of hot carriers with sidewalls of an STI structure, thereby reducing damage to the STI structure and trapped charges. Further, vertical dopant concentration profiles in the drift-region well may be selected in a manner that increases the HCI immunity.

Referring to FIG. 1, an intermediate structure according to an embodiment of the present disclosure is illustrated. The intermediate structure may include many node areas for forming electrical nodes of a field effect transistor. For example, the intermediate structure may include a drain area 100 for forming a drain region therein, a source area 200 for forming one or more source regions therein, and a body contact area 300 for forming one or more body contact regions therein. In one embodiment, the drain area 100, the at least one source area 200, and the at least one body contact area 300 may have a nested configuration in which the drain area 100 may be encircled by a source area 200, and the source area may be encircled by the body contact area 300. Alternatively, the drain area 100, the at least one source area 200, and the at least one body contact area 300 may have a non-nested configuration such as a linear configuration in which a first body contact area 300, a first source area 200, a drain area 100, a second source area 200, and a second body contact area 300 may be arranged in order along a horizontal direction. The lateral dimensions of the drain area 100, the at least one source area 200, and the at least one body contact area 300 may be selected based on the operational voltage and the current rating of a high voltage field effect transistor to be subsequently formed. For example, each of the drain area 100, the at least one source area 200, and the at least one body contact area 300 may have a rectangular outer periphery, and a width of the drain area 100 as measured between a parallel pair of edges of a respective outer periphery may be in a range from 1 micron to 100 microns, such as from 3 microns to 30 microns, although lesser and greater widths may also be used. The width of each of the at least one source area 200 and the at least one body contact area 300, as measured between a neighboring pair of edges of a periphery or between a neighboring pair of an edge of an inner periphery and an edge of an outer periphery, may be in a range from 1 micron to 100 microns, such as from 3 microns to 30 microns, although lesser and greater widths may also be used.

The intermediate structure may include a semiconductor-on-insulator (SOI) substrate 8. The SOI substrate may include a vertical stack of a substrate semiconductor layer 2, a buried insulating layer 4, and a semiconductor material layer 6. The substrate semiconductor layer 2 may have a high electrical resistivity to reduce capacitive coupling between the substrate semiconductor layer 2 and the semiconductor material layer 6. The range of the direct-current resistivity of the semiconductor material (such as single crystalline silicon) in the substrate semiconductor layer 2 may be in the range from $3.0 \times 10^2$ $\Omega$-cm to $3.0 \times 10^4$ $\Omega$-cm, such as a range from $1.0 \times 10^3$ $\Omega$-cm to $1.0 \times 10^4$ $\Omega$-cm. A direct-current resistivity refers to the resistivity of the material in the under a direct current (DC) electrical bias condition. Such high DC resistivity for the substrate semiconductor layer 2 may be provided by using a single crystalline semiconductor material having a very low level of electrical doping. For example, the substrate semiconductor layer 2 may include single crystalline silicon having an atomic concentration of electrical dopants (which may be p-type dopants or n-type dopants) in a range from $3.0 \times 10^{11}/cm^3$ to $3.0 \times 10^{13}/cm^3$, such as a range from $1.0 \times 10^{12}/cm^3$ to $1.0 \times 10^{13}/cm^3$. The electrical dopants may be p-type electrical dopants such as boron or n-type electrical dopants such as phosphorus, arsenic, and/or antimony.

The thickness of the substrate semiconductor layer 2 may be selected to provide sufficient mechanical support to layers and structures to be subsequently formed thereupon. In one embodiment, the thickness of the substrate semiconductor layer 2 may be in a range from 100 microns to 2 mm. In one embodiment, the entirety of the substrate semiconductor layer 2 may be single crystalline. In one embodiment, the substrate semiconductor layer 2 may include, and/or may consist of, single crystalline silicon. In one embodiment, the substrate semiconductor layer 2 may include, and/or may consist of, a commercially available silicon substrate having a diameter such as 200 mm, 300 mm, or 450 mm, and having DC resistivity in a range from $3.0 \times 10^2$ $\Omega$-cm to $3.0 \times 10^4$ $\Omega$-cm.

The buried insulating layer 4 may include an insulating material such as silicon oxide. In one embodiment, the buried insulating layer 4 may include high quality silicon oxide formed by thermal oxidation of silicon. The thickness of the buried insulating layer 4 may be in a range from 100 nm to 300 nm, although lesser and greater thicknesses may also be used.

The semiconductor material layer 6 may include a single crystalline semiconductor material such as single crystalline silicon. The thickness of the semiconductor material layer 6 may be in a range from 600 nm to 2,000 nm, such as from 800 nm to 1,500 nm, although lesser and greater thicknesses may also be used. The semiconductor material layer 6 may include electrical dopants of a first conductivity type, which may be p-type dopants or n-type dopants. The atomic concentration of the electrical dopants of the first conductivity type in the semiconductor material layer 6 may be in a range from $1 \times 10^{14}$/cm³ to $3 \times 10^{16}$/cm³, such as from $3 \times 10^{14}$/cm³ to $1 \times 10^{16}$/cm³, although lesser and greater average dopant concentrations may also be used.

Figure 2:
FIG. 2 is a vertical cross-sectional view of the intermediate structure after formation of doped wells according to an embodiment of the present disclosure.
Figure 2:
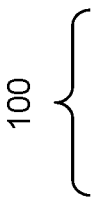

Referring to FIG. 2, various doped wells (22, 23) may be formed by implanting electrical dopants into an upper portion of the semiconductor material layer 6. In an illustrative example, a second-conductivity-type layer may be formed in an upper portion of the semiconductor material layer 6 by implanting dopants of a second conductivity type into the upper portion of the semiconductor material layer 6. The second conductivity type is the opposite of the first conductivity type. For example, if the first conductivity type is p-type, the second conductivity type is n-type, and vice versa. The implantation depth of the dopants of the second conductivity type is less than the thickness of the semiconductor material layer 6. The dose of the dopants of the second conductivity type may be selected such that the implanted portion of the semiconductor material layer 6 includes the dopants of the second conductivity type at a higher atomic concentration than dopants of the first conductivity type (as provided within the material of the semiconductor material layer 6 at the processing steps of FIG. 1).

The unimplanted portion of the semiconductor material layer 6 is herein referred to as a buried doped semiconductor layer 7. The buried doped semiconductor layer 7 may have a thickness in a range from 200 nm to 1,400 nm, such as from 300 nm to 1,000 nm, although lesser and greater thicknesses may also be used. The buried doped semiconductor layer 7 may include electrical dopants of the first conductivity type at an atomic concentration in a range from $1 \times 10^{14}$/cm³ to $3 \times 10^{16}$/cm³, such as from $3 \times 10^{14}$/cm³ to $1 \times 10^{16}$/cm³, although lesser and greater average dopant concentrations may also be used.

The implanted portion of the semiconductor material layer 6 that may be formed above the buried doped semiconductor layer 7 by implantation of dopants of the second conductivity type includes dopants of the second conductivity type at a higher atomic concentration than dopants of the first conductivity type. Thus, the implanted portion of the semiconductor material layer 6 may have a doping of the second conductivity type, and thus, constitutes the second-conductivity-type layer. The net dopant concentration (i.e., the atomic concentration of dopants of the second conductivity type less the atomic concentration of dopants of the first conductivity type) in the second-conductivity type layer may be in range from $1 \times 10^{14}$/cm³ to $3 \times 10^{17}$/cm³, such as from $3 \times 10^{14}$/cm³ to $1 \times 10^{17}$/cm³, although lesser and greater net dopant concentrations may also be used. The thickness of the second-conductivity-type layer may be in a range from 200 nm to 1,000 nm, such as from 300 nm to 800 nm, although lesser and greater thicknesses may also be used.

A masked ion implantation process may be subsequently performed to implant dopants of the first conductivity type. For example, a first implantation mask (not shown) may be formed to cover the drain area 100 without covering the body contact areas 300 and the source areas 200. The first implantation mask may be a patterned photoresist layer. Dopants of the first conductivity type may be implanted into unmasked portions of the second-conductivity-type layer such that implanted portions of the second-conductivity-type layer include more dopants of the first conductivity type than dopants of the second conductivity type. Each implanted portion of second-conductivity-type layer is converted into a doped semiconductor well having a doping of the first conductivity type, which is herein referred to as a source-side doped well 23. Each source-side doped well 23 is connected to the buried doped semiconductor layer 7. The net dopant concentration (i.e., the atomic concentration of dopants of the first conductivity type less the atomic concentration of dopants of the second conductivity type) in each source-side doped well 23 may be in range from $3 \times 10^{14}$/cm³ to $3 \times 10^{18}$/cm³, such as from $1 \times 10^{15}$/cm³ to $1 \times 10^{18}$/cm³, and/or from $3 \times 10^{15}$/cm³ to $3 \times 10^{17}$/cm³, although lesser and greater net dopant concentrations may also be used. The first implantation mask may be subsequently removed, for example, by ashing.

Each remaining portion of the second-conductivity-type layer that is not implanted with any additional dopants during the masked ion implantation process is herein referred to as a drift-region well 22. Each drift-region well 22 has a net dopant concentration (i.e., the atomic concentration of dopants of the second conductivity type less the atomic concentration of dopants of the first conductivity type) in range from $1 \times 10^{14}$/cm³ to $3 \times 10^{17}$/cm³, such as from $3 \times 10^{14}$/cm³ to $1 \times 10^{17}$/cm³, although lesser and greater net dopant concentrations may also be used. The thickness of the drift-region wells 22 may be in a range from 200 nm to 1,000 nm, such as from 300 nm to 800 nm, although lesser and greater thicknesses may also be used. The semiconductor material layer 6 comprises a buried doped semiconductor layer 7, source-side doped wells 23, and drift-region wells 22.

Doped layer stacks to be subsequently formed in the intermediate structure include pairs of first doped layer stacks and second doped layer stacks that adjacent to each other. The first doped layer stacks may be distal from a respective most proximal vertical p-n junction between a respective source-side doped well 23 and a respective drift-region well 22. The second doped layer stacks may be proximal to the respective most proximal vertical p-n junction between the respective source-side doped well 23 and the respective drift-region well 22. Such first doped layer stacks are referred to as distal doped layer stacks. Such second doped layer stacks are referred to as proximal doped layer stacks. Thus, the terms "proximal" and "distal," as they relate to doped layer stacks, refer to proximity to, or distality from, a respective most proximal vertical p-n junction therefrom, respectively.

Figure 3:
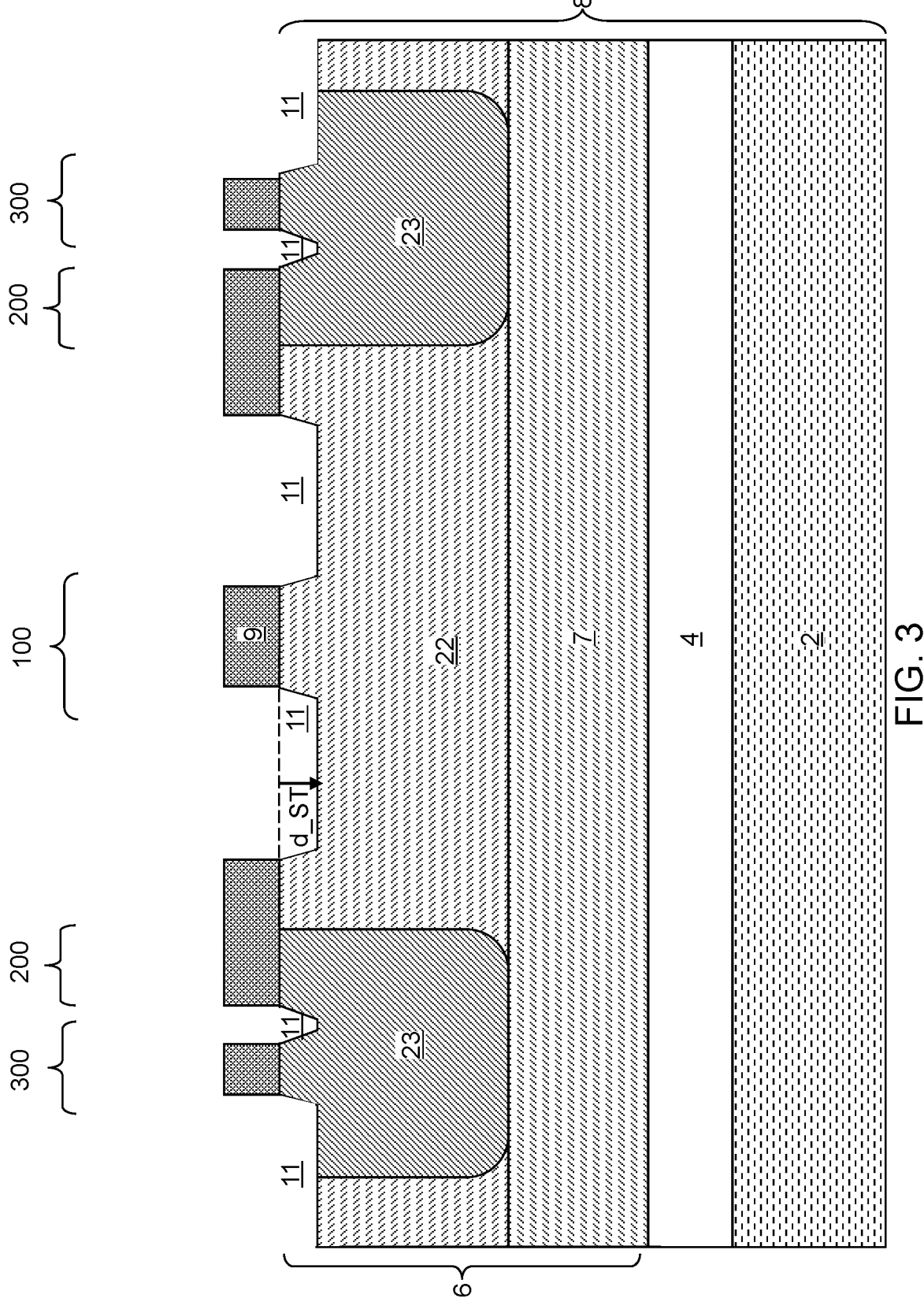
FIG. 3 is a vertical cross-sectional view of an intermediate structure after formation of shallow trenches according to an embodiment of the present disclosure.

Referring to FIG. 3, shallow trenches 11 may be formed in an upper portion of the semiconductor material layer 6. For example, a first hard mask layer 9 may be formed over the top surface of the semiconductor material layer 6. The first hard mask layer 9 includes a dielectric material such as silicon nitride. The thickness of the hard mask layer 9 may be in a range from 50 nm to 200 nm, although lesser and greater thicknesses may also be used. A photoresist layer (not shown) may be applied over the first hard mask layer 9, and may be lithographically patterned. The pattern in the photoresist layer may be transferred into the first hard mask layer 9 using an anisotropic etch process such as a reactive ion etch process. The photoresist layer may be removed, for example, by ashing after patterning the first hard mask layer 9. Alternatively, the photoresist layer may be removed after formation of the shallow trenches 11.

The openings in the first hard mask layer 9 may include a first opening that is formed around the drain area 100, at least one second opening that is formed between a source area 200 and a body contact area 300, and at least one third opening that is formed at an outside periphery of each body contact area 300. An anisotropic etch process may be performed to transfer the pattern in the first hard mask layer 9 through an upper portion of the semiconductor material layer 6. Shallow trenches 11 may be formed in cavities formed by removal of the semiconductor material from the semiconductor material layer 6. The shallow trenches 11 laterally surround unetched portions of the semiconductor material layer 6 that are proximal to the topmost surface of the semiconductor material layer 6. Such unetched upper portions of the semiconductor material layer 6 are located within the drain area 100, the at least one source area 200, and the at least one body contact area 300, and may be subsequently used to form a drain region, at least one source region, and at least one body contact region. The depth dST of the shallow trenches 11 may be in a range from 100 nm to 400 nm, such as from 150 nm to 300 nm, although lesser and greater depths may also be used.

Figure 4A:
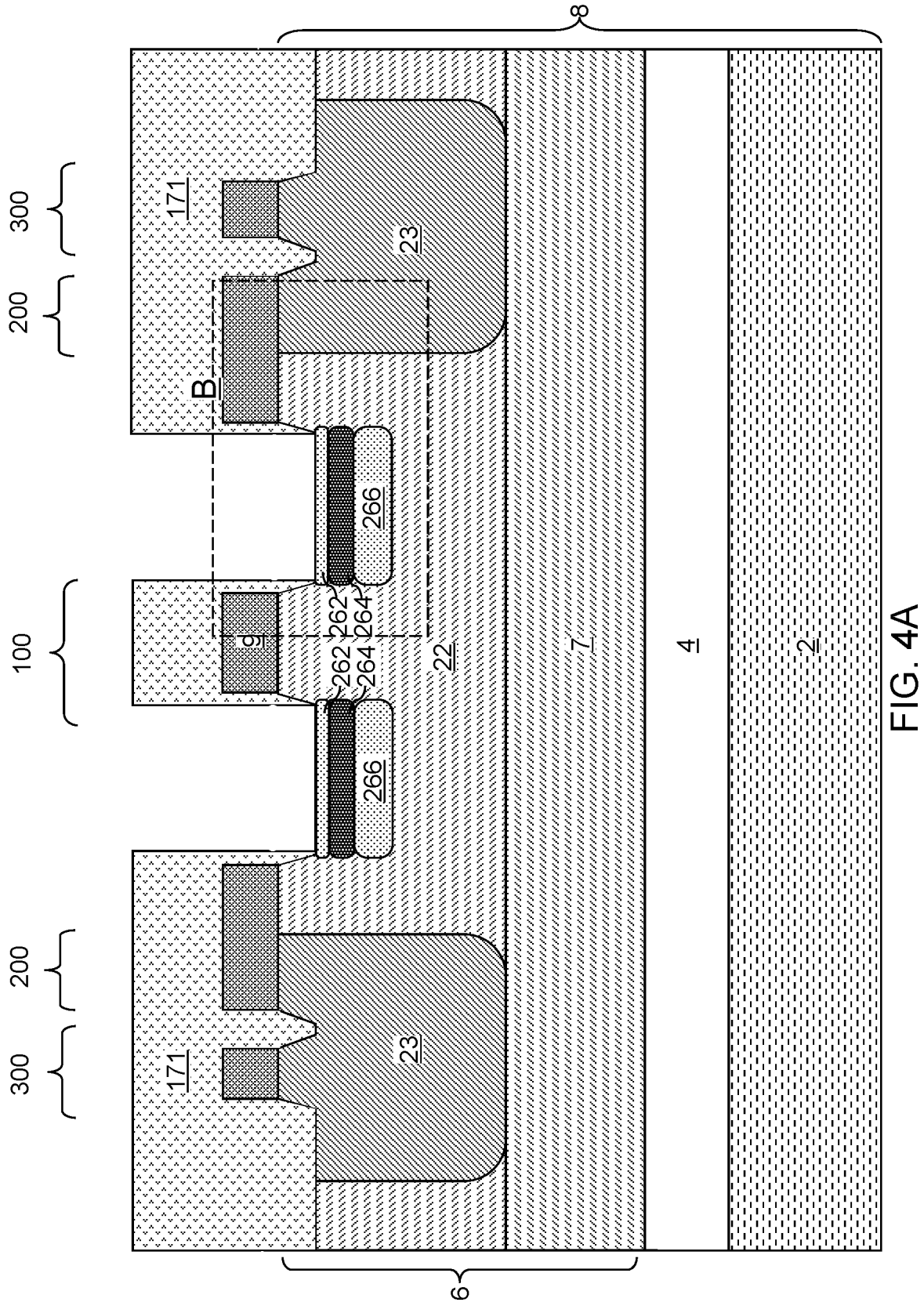
FIG. 4A is a vertical cross-sectional view of the intermediate structure after formation of distal doped layer stacks according to an embodiment of the present disclosure.
Figure 4B:
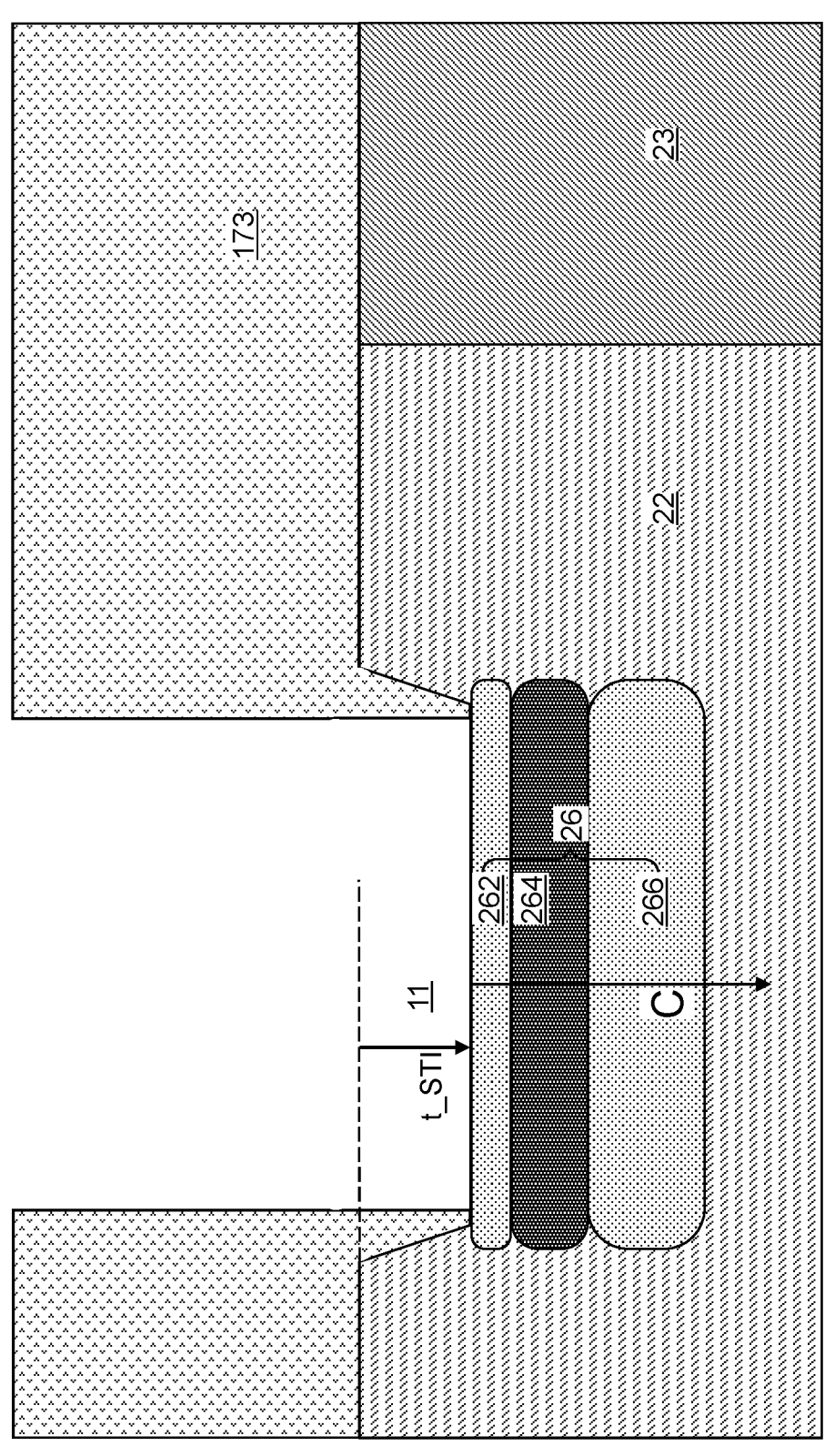
FIG. 4B is a magnified view of region B of FIG. 4A.

Referring to FIGS. 4A and 4B, a first photoresist layer 171 may be applied over the first hard mask layer 9, and may be lithographically patterned to form openings in areas of a subset of the shallow trenches that are located around the drain area 100. In one embodiment, each opening in the first photoresist layer 171 may have a bottom edge that is located entirely on a recessed planar surface of a respective portion of the shallow trenches 11. Generally, each opening in the first photoresist layer 171 may laterally extend from about a bottom edge of a sidewall of a portion of the shallow trenches 11 located at a periphery of a respective source area 200 to about a bottom edge of another sidewall of the portion of the shallow trenches located at a periphery of a respective drain area 100.

A set of ion implantation processes may be performed to implant dopants of a second conductivity type into portions of the semiconductor material layer 6 that underlie openings in the first photoresist layer 171. The second conductivity type is the opposite of the first conductivity type. For example, if the first conductivity type is p-type, the second conductivity type is n-type, and vice versa. The set of ion implantation processes may be performed such that a vertical stack of doped semiconductor material layers having a respective doping of the second conductivity type is formed underneath each opening in the first photoresist layer 171.

Each vertical stack of doped semiconductor material layers formed by implantation of dopants of the second conductivity type through openings in the first photoresist layer 171 is herein referred to as a distal doped layer stack 26. Each distal doped layer stack 26 is more distal from a vertical p-n junction between a source-side doped well 23 and a drift-region well 22 than a respective additional doped layer stack to be subsequently formed (shown in FIGS. 8A and 8B; also referred to as a proximal doped layer stack) will be from the vertical p-n junction. In one embodiment, each distal doped layer stack 26 may comprise a set of distal doped semiconductor layers (262, 264, 266) having different average atomic concentrations of dopants of the second conductivity type.

Figure 4C:
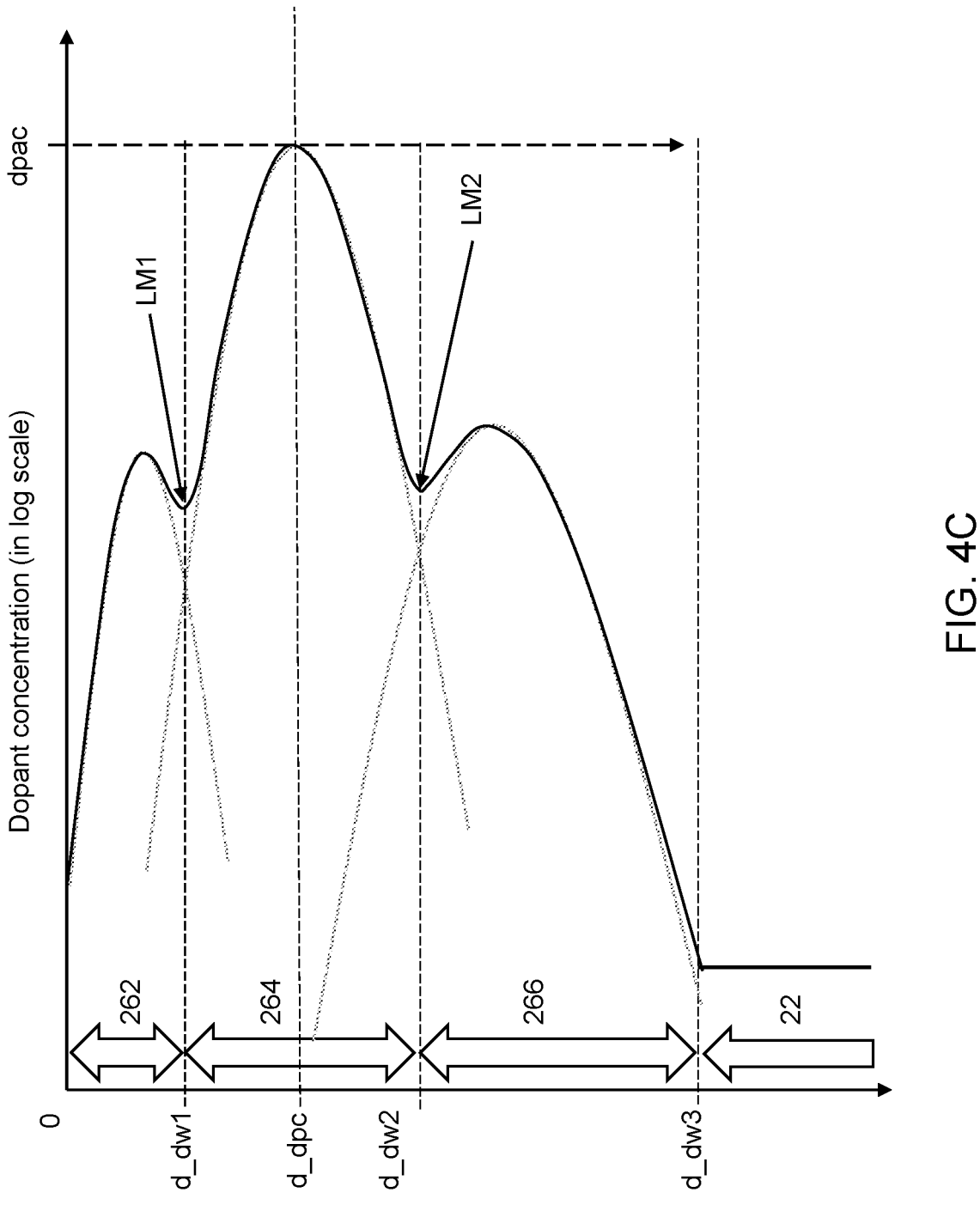
FIG. 4C is a first vertical dopant concentration profile of dopants of a second conductivity type along a downward vertical direction in a distal doped layer stack and a drift-region well according to an embodiment of the present disclosure.

Referring to FIG. 4C, a vertical atomic concentration profile of dopants of the second conductivity type in a distal doped layer stack 26 is illustrated. The vertical atomic concentration profile may be a variable atomic concentration profile that varies as a function of a depth from a bottom surface of an unmasked portion of the shallow trenches 11, such as the direction C illustrated in FIG. 4B. The variable atomic concentration profile may be referred to as a second variable atomic concentration profile, or as a distal variable atomic concentration profile.

In one embodiment, each set of distal doped semiconductor layers (262, 264, 266) may comprise, from top to bottom, a first distal doped semiconductor layer 262 including atoms of the dopants of the second conductivity type at a first average distal atomic concentration, a second distal doped semiconductor layer 264 including atoms of the dopants of the second conductivity type at a second average distal atomic concentration, and a third distal doped semiconductor layer 266 including atoms of the dopants of the second conductivity type at a third average distal atomic concentration. In one embodiment, the second average distal atomic concentration is greater than the first average distal atomic concentration, and the second average distal atomic concentration is greater than the third average distal atomic concentration. The average atomic concentration of dopants of the second conductivity type in the drift-region wells 22 is less than the third average distal atomic concentration. Generally, each distal doped layer stack 26 may have a variable atomic concentration profile as a function of a depth from a bottom surface of a respective portion of the shallow trench 11.

The interface between the first distal doped semiconductor layer 262 and the second distal doped semiconductor layer 264 may be located at a first distal well depth d_dw1. The interface between the second distal doped semiconductor layer 264 and the third distal doped semiconductor layer 266 may be located at a second distal well depth d_dw2. The interface between the third distal doped semiconductor layer 266 and the drift-region well 22 may be located at a third distal well depth d_dw3. In one embodiment, the variable atomic concentration profile has a peak atomic concentration dpac for the dopants of the second conductivity type at a depth, which is herein referred to as a distal peak concentration depth d_dpc. In one embodiment, the variable atomic concentration profile may have a first local minimum LM1 at an interface between the first distal doped semiconductor layer 262 and the second distal doped semiconductor layer 264, and may have a second local minimum LM2 at an interface between the second distal doped semiconductor layer 264 and the third distal doped semiconductor layer 266.

In an illustrative example, the atomic concentration of the electrical dopants of the first conductivity type in the buried doped semiconductor layer 7 may be in a range from $1 \times 10^{14}/\text{cm}^3$ to $3 \times 10^{16}/\text{cm}^3$, such as from $3 \times 10^{14}/\text{cm}^3$ to $1 \times 10^{16}/\text{cm}^3$, although lesser and greater average dopant concentrations may also be used. The first average distal atomic concentration of dopants of the second conductivity type in the first distal doped semiconductor layer 262 may be in a range from $1 \times 10^{15}/\text{cm}^3$ to $3 \times 10^{17}/\text{cm}^3$, such as from $3 \times 10^{15}/\text{cm}^3$ to $1 \times 10^{17}/\text{cm}^3$, and/or from $1 \times 10^{16}/\text{cm}^3$ to $3 \times 10^{16}/cm^3$, although lesser and greater average dopant concentrations of dopants of the second conductivity type may also be used. The second average distal atomic concentration of dopants of the second conductivity type in the second distal doped semiconductor layer 264 may be in a range from $1 \times 10^{16}/cm^3$ to $1 \times 10^{19}/cm^3$, such as from $3 \times 10^{16}/cm^3$ to $3 \times 10^{18}/cm^3$, and/or from $1 \times 10^{17}/cm^3$ to $1 \times 10^{18}/cm^3$, although lesser and greater average dopant concentrations of dopants of the second conductivity type may also be used. The third average distal atomic concentration of dopants of the second conductivity type in the third distal doped semiconductor layer 266 may be in a range from $1 \times 10^{15}/cm^3$ to $3 \times 10^{17}/cm^3$, such as from $3 \times 10^{15}/cm^3$ to $1 \times 10^{17}/cm^3$, and/or from $1 \times 10^{16}/cm^3$ to $3 \times 10^{16}/cm^3$, although lesser and greater average dopant concentrations of dopants of the second conductivity type may also be used. The peak atomic concentration dpac may be in a range from $3 \times 10^{16}/cm^3$ to $3 \times 10^{19}/cm^3$, such as from $1 \times 10^{17}/cm^3$ to $1 \times 10^{19}/cm^3$, and/or from $3 \times 10^{17}/cm^3$ to $3 \times 10^{18}/cm^3$, although lesser and greater peak dopant concentrations of dopants of the second conductivity type may also be used.

The first distal well depth d_dw1 may be in a range from 20 nm to 100 nm, although lesser and greater depths may also be used. The second distal well depth d_dw2 may be in a range from 50 nm to 200 nm, although lesser and greater depths may also be used. The third distal well depth d_dw3 may be in a range from 80 nm to 400 nm, although lesser and greater depths may also be used. The interface between the third distal doped semiconductor layer 266 and the drift-region well 22 may be located above the interface between the drift-region well 22 and the buried doped semiconductor layer 7.

Figure 5A:
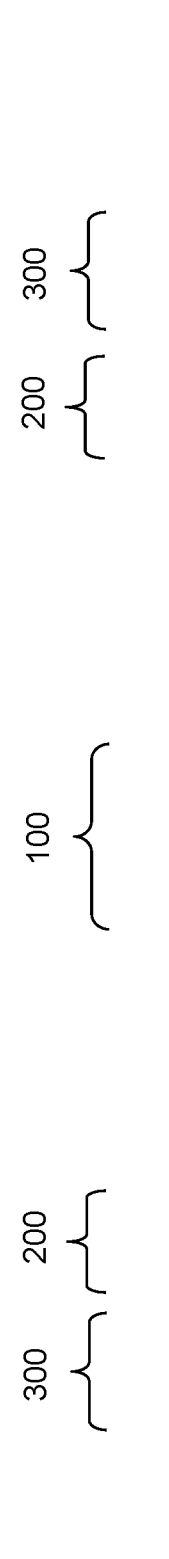
FIG. 5A is a vertical cross-sectional view of the intermediate structure after formation of shallow trench isolation structures according to an embodiment of the present disclosure.
Figure 5B:
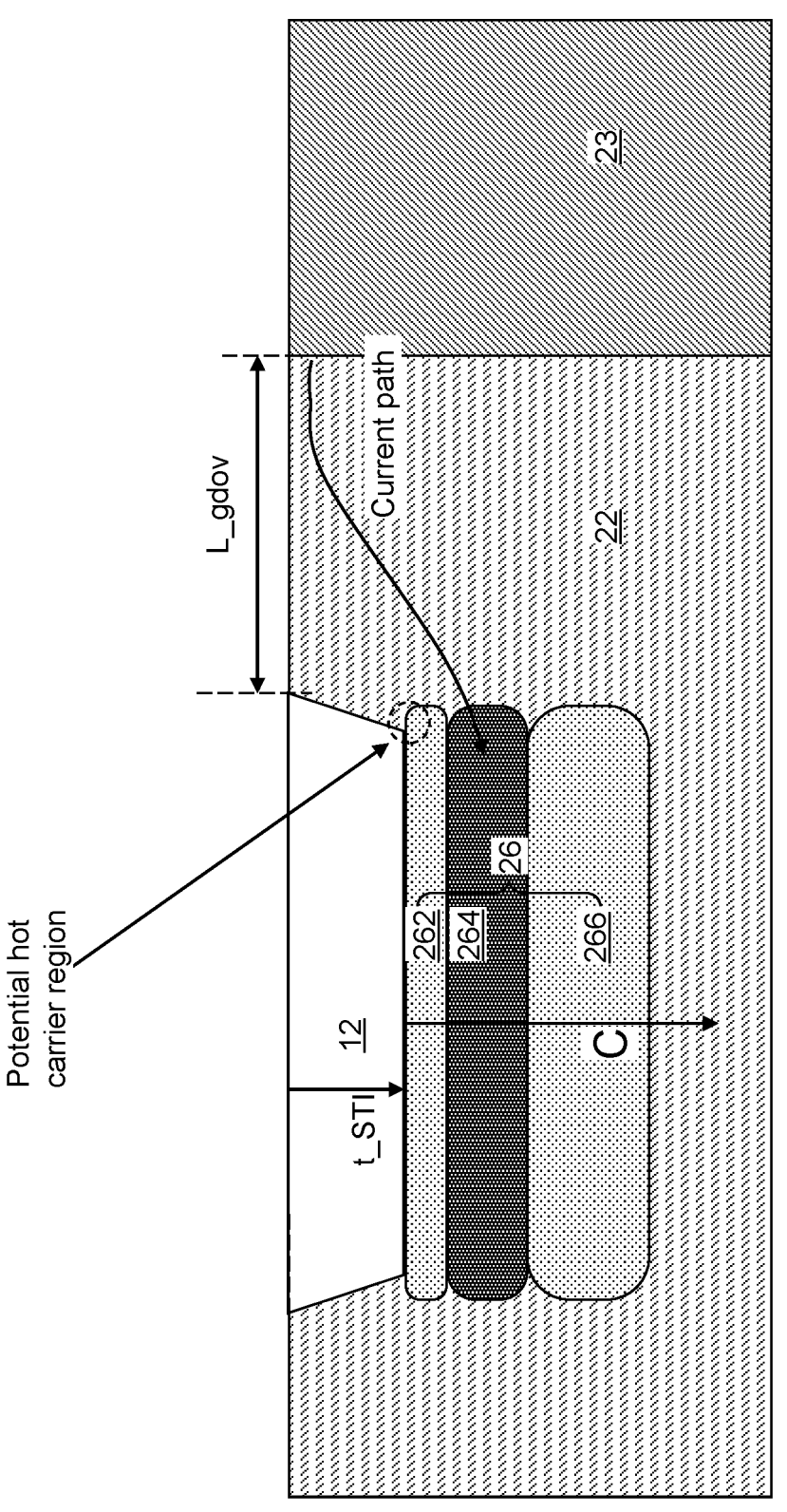
FIG. 5B is a magnified view of region B of FIG. 5A.

Referring to FIGS. 5A and 5B, a dielectric fill material such as silicon oxide may be deposited in the shallow trenches 11 by a conformal deposition process such as a chemical vapor deposition process. Excess portions of the dielectric fill material may be removed from above the horizontal plane including the top surface of the first hard mask layer 9 by performing a planarization process, which may include a chemical mechanical polishing process and/or a recess etch process. Remaining portions of the dielectric fill material may be subsequently recessed, for example, by performing a wet etch process that recesses top surfaces of the remaining portions of the dielectric material approximately down to the horizontal plane including the topmost surface of the semiconductor material layer 6. A shallow trench isolation structure 12 may be formed in the shallow trenches. The shallow trench isolation structure 12 includes remaining portions of the dielectric fill material, which may include silicon oxide. The top surface of the shallow trench isolation structure 12 may be located above, below, or at the horizontal plane including the topmost surface of the semiconductor material layer 6. The first hard mask layer 9 may be subsequently removed selective to the materials of the semiconductor material layer 6 and the shallow trench isolation structure 12, for example, using a wet etch process. For example, if the first hard mask layer 9 comprises silicon nitride, a wet etch process using hot phosphoric acid may be used to remove the first hard mask layer 9.

The shallow trench isolation structure 12 may be a single continuous structure including multiple shallow trench isolation portions (12A, 12B, 12C) that are interconnected to one another, or may include multiple shallow trench isolation portions (12A, 12B, 12C) that are disjoined from one another depending on the configuration of the drain region, the at least one source region, and the at least one body contact region to be subsequently formed. In one embodiment, a drain area 100 may be laterally surrounded by a first shallow trench isolation portion 12A, which is also referred to as a first portion 12A of the shallow trench isolation structure 12. The first shallow trench isolation portion 12A may be laterally surrounded by a source area 200. The source area 200 may be laterally surrounded by a second shallow trench isolation portion 12B. The second shallow trench isolation portion 12B may be laterally surrounded by a body contact area 300. The body contact area 300 may be laterally surrounded by a third shallow trench isolation portion 12C. Alternatively, a drain area 100, at least one source area 200, and at least one body contact area 300 may be arranged in a non-nested configuration, and at least two of the first shallow trench isolation portion 12A, the second shallow trench isolation portion 12B, and the third shallow trench isolation portion 12C may be adjoined to each other or among one another. The thickness t_STI of the shallow trench isolation structure 12 may be in a range from 100 nm to 400 nm, such as from 150 nm to 300 nm, although lesser and greater thicknesses may also be used.

The first shallow trench isolation portion 12A (i.e., the first portion 12A of the shallow trench isolation structure 12) overlies the drift-region well 22 and the distal doped layer stack 26, and is laterally spaced from the source-side doped well 23. The first shallow trench isolation portion 12A is laterally spaced from a p-n junction between the source-side doped well 23 and the drift-region well 22 by a lateral distance, which is herein referred to as a gate-drain overlap distance L_gdov. According to an aspect of the present disclosure, the ratio of the gate-drain overlap distance L_gdov to the shallow trench isolation thickness t_STI may be selected such that a predominant fraction (such as more than 50% and/or more than 90%, and/or more than 99%), of the channel current may deviate from the surface current path along the top surface of the drift-region well 22 and a proximal sidewall of the first shallow trench isolation portion 12A, and may be deflected downward into the second distal doped semiconductor layer 264. Generally, in instances in which the ratio of the gate-drain overlap distance L_gdov to the shallow trench isolation thickness t_STI is low, a high percentage of the channel current flows close to a bottom edge of a proximal sidewall of the first shallow trench isolation portion 12A, and causes hot carrier injection into a corner region of the first shallow trench isolation portion 12A. The corner region is marked as "Potential hot carrier region" in FIG. 5B.

According to an aspect of the present disclosure, the ratio of the gate-drain overlap distance L_gdov to the shallow trench isolation thickness t_STI is set at a value that causes the current path during operation of the field effect transistor to be subsequently formed to enter into the second distal doped semiconductor layer 264. According to simulations performed by the inventors of the present disclosure, the ratio of the gate-drain overlap distance L_gdov to the shallow trench isolation thickness t_STI is preferably configured to be greater than 2.5 to ensure that the fraction of the electrical current that flows adjacent to the potential hot carrier region is limited, i.e., less than 1% and/or less than 0.1%.

In one embodiment, the ratio of the gate-drain overlap distance L_gdov to the shallow trench isolation thickness t_STI may be a range from 3 to 1,000, such as from 3 to 100, and/or from 4 to 10. In one embodiment, the ratio of the gate-drain overlap distance L_gdov to the shallow trench isolation thickness t_STI may be greater than 2.5, and may be greater than 3.0, and/or greater than 4.0, and/or greater than 5.0, and/or greater than 7.0, and/or greater than 10, and/or greater than 15, and/or greater than 20, and/or greater than 30. In one embodiment, the ratio of the gate-drain overlap distance L_gdov to the shallow trench isolation thickness t_STI may be less than 1,000, and/or may be less than 300, and/or less than 100, and/or less than 30, and/or less than 20, and/or less than 15, and/or less than 10, and/or less than 7, and/or less than 5. In one embodiment, the ratio of the gate-drain overlap distance L_gdov to the shallow trench isolation thickness t_STI may be a range from 3 to 100, and preferably from 3 to 5.0. Generally, an indefinite increase in the ratio of the gate-drain overlap distance L_gdov to the shallow trench isolation thickness t_STI beyond 1,000 is impracticable because such an increase will increase the device area without tangible benefits. Thus, a value of less than 100 for the ratio of the gate-drain overlap distance L_gdov to the shallow trench isolation thickness t_STI is preferred. Further, decreasing the ratio of the gate-drain overlap distance L_gdov to the shallow trench isolation thickness t_STI below 3 causes an increase in the current that flows toward the potential hot carrier region, and includes hot carrier injection and degrades device performance of the field effect transistor. Thus, a range from 3 to 100 is preferred for the ratio of the gate-drain overlap distance L_gdov to the shallow trench isolation thickness t_STI. A range from 4 to 10 is more preferred an optimal range for the ratio of the gate-drain overlap distance L_gdov to the shallow trench isolation thickness t_STI.

Figure 6:
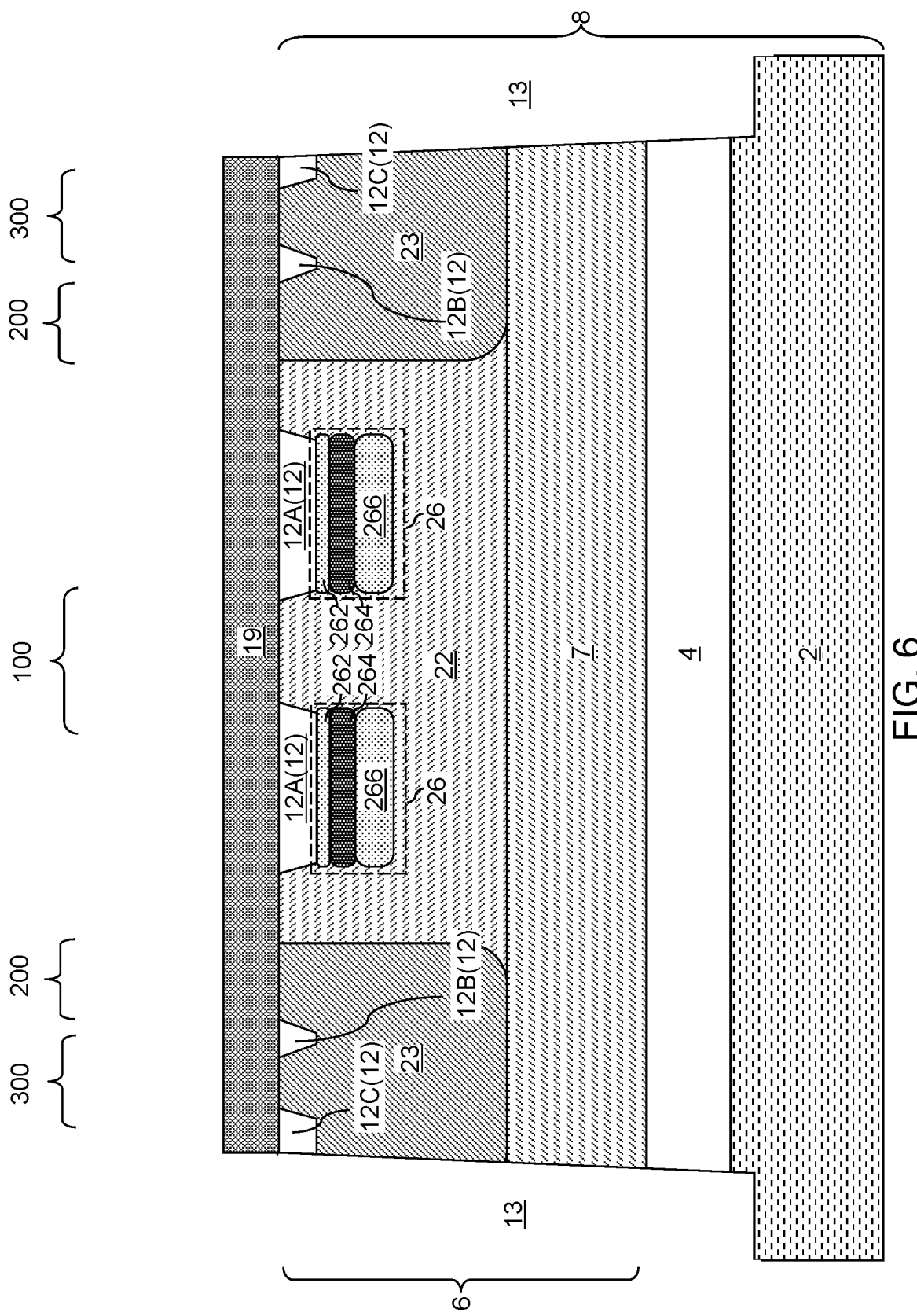
FIG. 6 is a vertical cross-sectional view of the intermediate structure after formation of deep trenches according to an embodiment of the present disclosure.

Referring to FIG. 6, deep trenches 13 may be formed. For example, a second hard mask layer 19 may be formed over the top surface of the semiconductor material layer 6 and the shallow trench isolation structure 12. The second hard mask layer 19 includes a dielectric material such as silicon nitride. A photoresist layer (not shown) may be applied over the second hard mask layer 19, and may be lithographically patterned to form at least one opening within the area of the third shallow trench isolation portion 12C. The pattern in the photoresist layer may be transferred into the second hard mask layer 19 using an anisotropic etch process such as a reactive ion etch process. The photoresist layer may be removed, for example, by ashing after patterning the first hard mask layer 19. Alternatively, the photoresist layer may be removed after formation of the deep trenches 13.

An anisotropic etch process may be performed to transfer the pattern in the second hard mask layer 19 through the third shallow trench isolation portion 12C, an underlying portion of the semiconductor material layer 6, and an underlying portion of the buried insulating layer 4, and into an upper portion of the substrate semiconductor layer 2. At least one deep trench 13 may be formed in at least one cavity formed by removal of the materials of the third shallow trench isolation portion 12C, the semiconductor material layer 6, the buried insulating layer 4, and the upper portion of the substrate semiconductor layer 2. The depth of each deep trench 13 may be in a range from 700 nm to 2,500 nm, such as from 1,000 nm to 2,000 nm, although lesser and greater depths may also be used. An upper region of each deep trench 13 may be laterally surrounded by a remaining portion of a third shallow trench isolation portion 12C.

Figure 7:
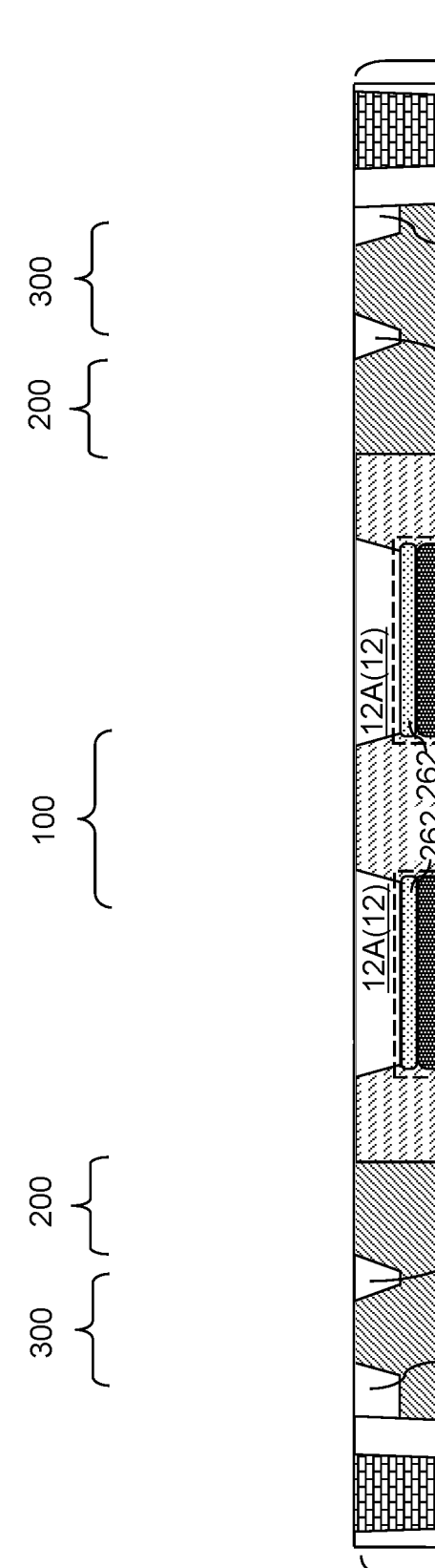
FIG. 7 is a vertical cross-sectional view of the intermediate structure after formation of deep trench isolation structures and substrate contact via structures according to an embodiment of the present disclosure.

Referring to FIG. 7, a dielectric material layer such as a silicon oxide layer may be conformally deposited in each deep trench 13 and over the second hard mask layer 19. For example, a chemical vapor deposition process may be used to deposit the dielectric material layer. The thickness of the dielectric material layer may be in a range from 30 nm to 300 nm, such as from 60 nm to 150 nm, although lesser and greater thicknesses may also be used. In one embodiment, the thickness of the dielectric material layer may be less than one half of the width of a bottom surface of each deep trench 13. An anisotropic etch process may be performed to remove horizontally-extending portions of the dielectric material layer. Each remaining vertically-extending portion of the dielectric material layer constitutes a deep trench isolation structure 14, which is also referred to as a deep trench spacer or a dielectric spacer.

At least one conductive material such as heavily doped amorphous silicon or heavily doped polysilicon may be deposited in the remaining volume of each deep trench 13 by a conformal deposition process such as a chemical vapor deposition process. The thickness of the deposited conductive material layer may be selected such that the entire volume of each deep trench 13 is filled with a combination of a deep trench isolation structure 14 and the at least one conductive material. Excess portions of the at least one conductive material may be removed from above the horizontal plane including the top surface of the semiconductor material layer 6, for example, by performing a recess etch process. The recess etch process may use a wet etch process or a reactive ion etch process. Each remaining portion of the at least one conductive material constitutes a substrate contact via structure 16, which provides an electrically conductive path between the substrate semiconductor layer 2 and metal interconnect structures to be subsequently formed. The substrate contact via structure 16 may be used to electrically bias the substrate semiconductor layer 2 during operation of a field effect transistor to be subsequently formed. The second hard mask layer 19 may be subsequently removed, for example, by a wet etch process. For example, if the second hard mask layer 19 comprises silicon oxide, a wet etch process using hot phosphoric acid may be used to remove the second hard mask layer 19.

In one embodiment, each deep trench isolation structure 14 comprises a dielectric material, and vertically extends at least from a shallow trench isolation structure (such as the third shallow trench isolation portion 12C) to the substrate semiconductor layer 2. A substrate contact via structure 16 vertically extends through the deep trench isolation structure 14 and contacts a semiconductor material within the substrate semiconductor layer 2.

Figure 8A:
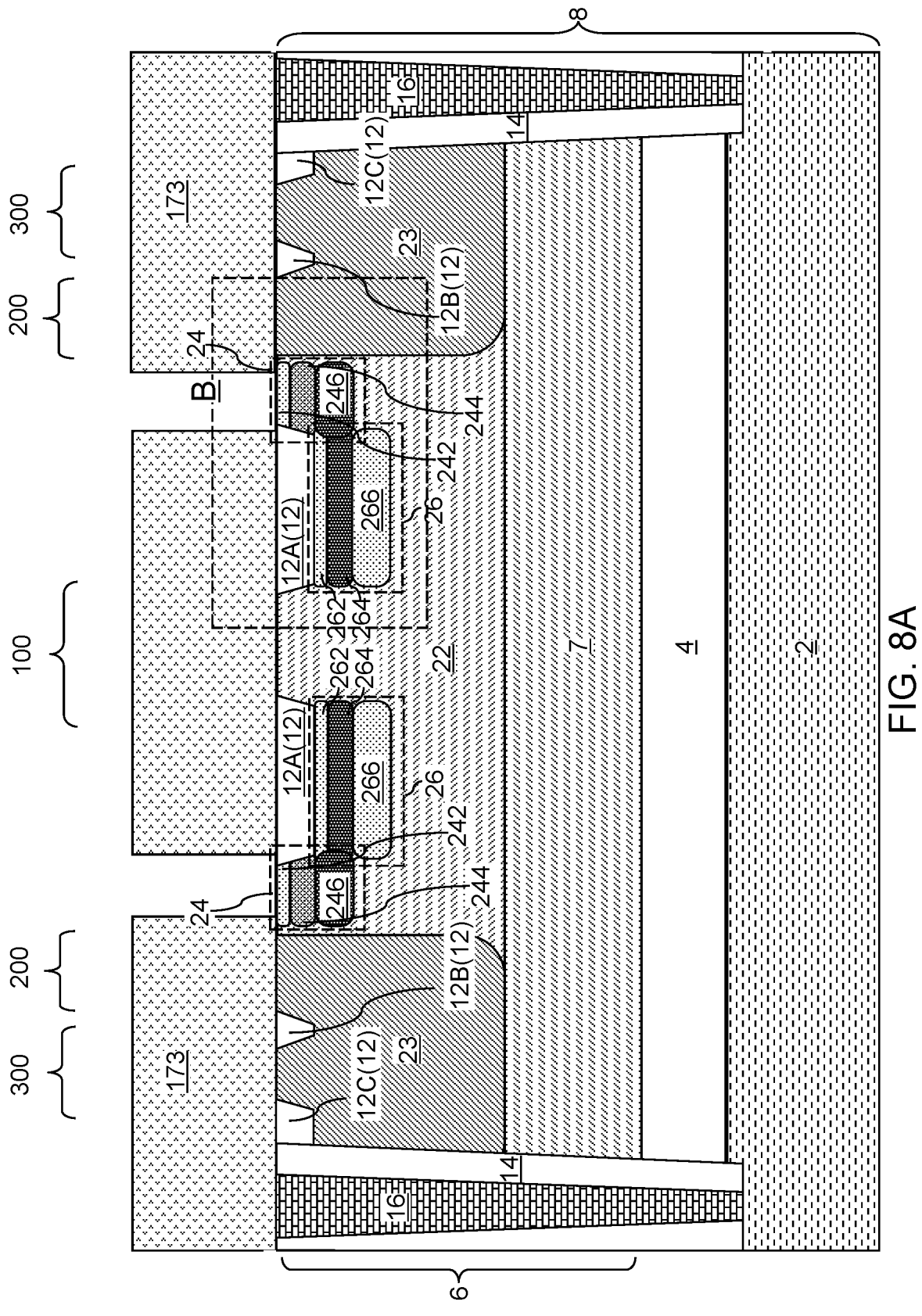
FIG. 8A is a vertical cross-sectional view of the intermediate structure after formation of proximal doped layer stacks according to an embodiment of the present disclosure.
Figure 8B:
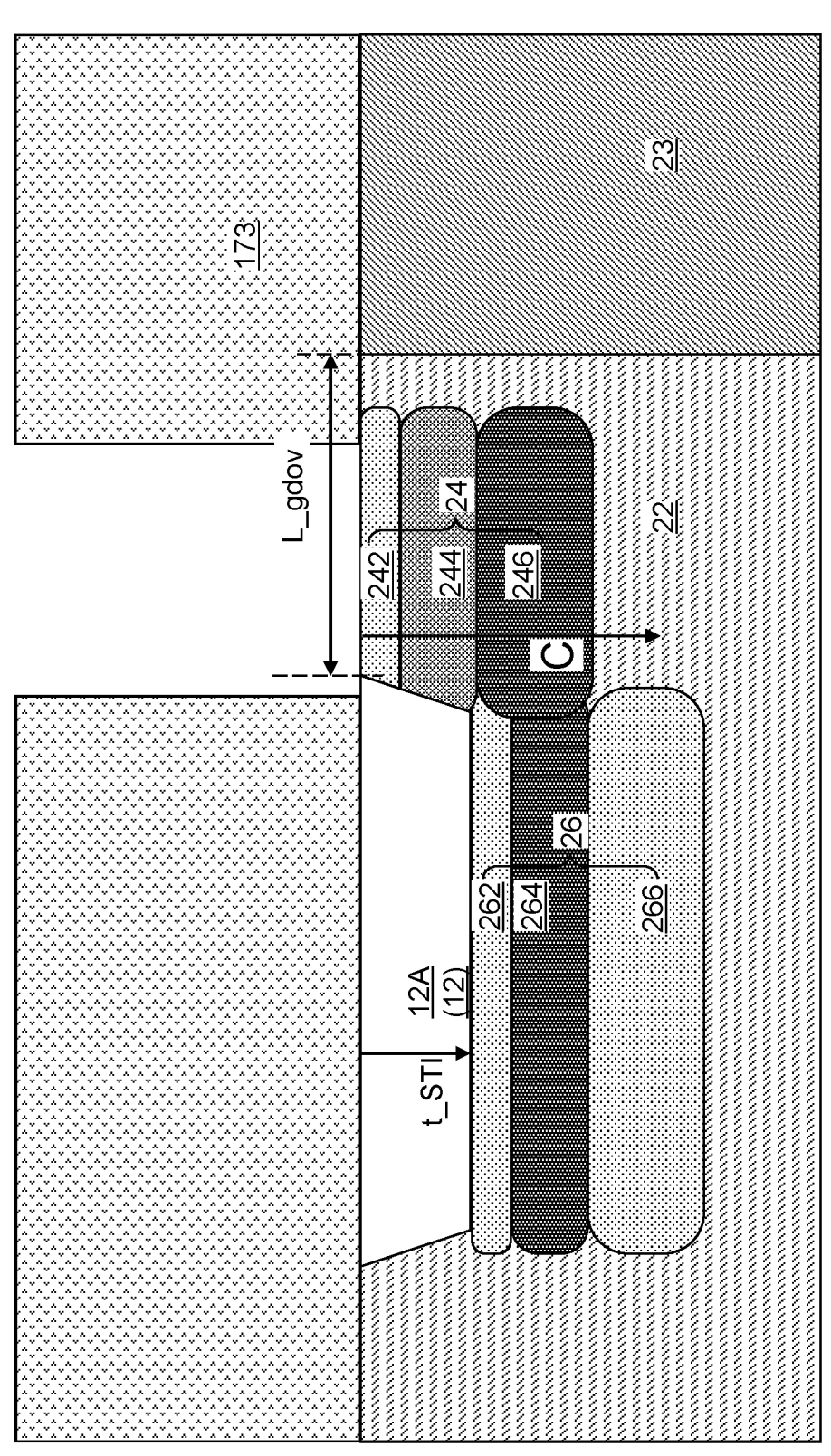
FIG. 8B is a magnified view of region B of FIG. 8A.

Referring to FIGS. 8A and 8B, a second photoresist layer 173 may be applied over the semiconductor material layer 6 and the shallow trench isolation structure 12, and may be lithographically patterned to form openings in areas between the first portions 12A of the shallow trench isolation structure 12 and the source areas 200.

A set of ion implantation processes may be performed to implant dopants of the second conductivity type into portions of the drift-region well 22 that underlie openings in the second photoresist layer 173. The set of ion implantation processes may be performed such that a vertical stack of doped semiconductor material layers having a respective doping of the second conductivity type may be formed underneath each opening in the second photoresist layer 173.

Each vertical stack of doped semiconductor material layers formed by implantation of dopants of the second conductivity type through openings in the second photoresist layer 173 is herein referred to as a proximal doped layer stack 24. Each proximal doped layer stack 24 may be more proximal to a vertical p-n junction between a source-side doped well 23 and a drift-region well 22 than a respective distal doped layer stack 26 is to the vertical p-n junction. In one embodiment, each proximal doped layer stack 24 may comprise a set of proximal doped semiconductor layers (242, 244, 246) having different average atomic concentrations of dopants of the second conductivity type.

Figure 8C:
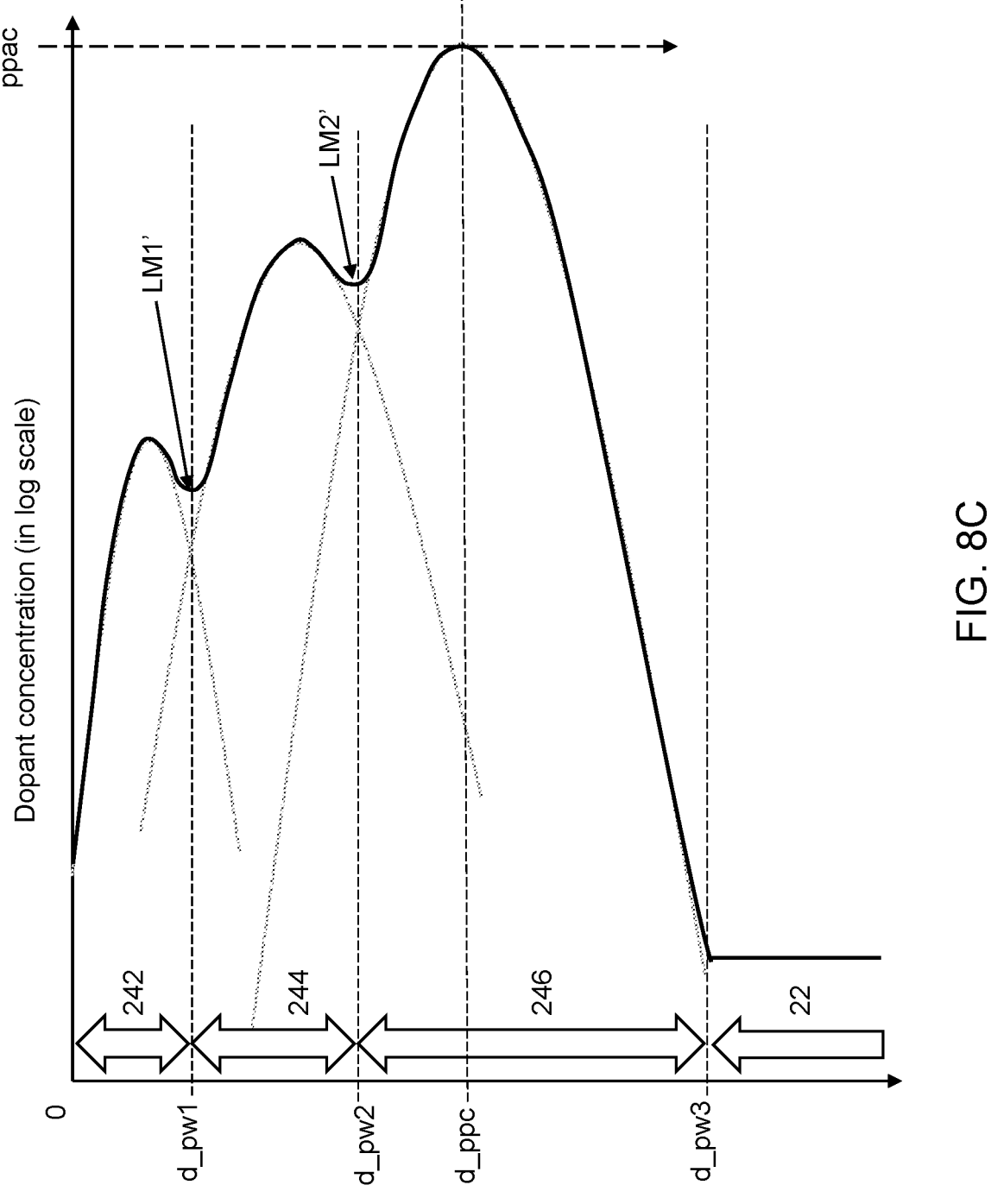
FIG. 8C is a first vertical dopant concentration profile of dopants of the second conductivity type along a downward vertical direction in a proximal doped layer stack and a drift-region well according to an embodiment of the present disclosure.

Referring to FIG. 8C, a vertical atomic concentration profile of dopants of the second conductivity type is illustrated in a proximal doped layer stack 24. The vertical atomic concentration profile may be a variable atomic concentration profile that varies as a function of a depth from the top surface of the semiconductor material layer 6, such as the direction C illustrated in FIG. 8B. The variable atomic concentration profile may be referred to as a first variable atomic concentration profile, or as a proximal variable atomic concentration profile.

In one embodiment, each set of proximal doped semiconductor layers (242, 244, 246) may comprise, from top to bottom, a first proximal doped semiconductor layer 242 including atoms of the dopants of the second conductivity type at a first average proximal atomic concentration, a second proximal doped semiconductor layer 244 including atoms of the dopants of the second conductivity type at a second average proximal atomic concentration, and a third proximal doped semiconductor layer 246 including atoms of the dopants of the second conductivity type at a third average proximal atomic concentration. In one embodiment, the second average proximal atomic concentration is greater than the first average proximal atomic concentration, and the third average proximal atomic concentration is greater than the second average proximal atomic concentration. The average atomic concentration of dopants of the second conductivity type in the drift-region wells 22 is less than the first average proximal atomic concentration. Generally, each proximal doped layer stack 24 may have a variable atomic concentration profile as a function of a depth from a top surface of the semiconductor material layer 6.

The interface between the first proximal doped semiconductor layer 242 and the second proximal doped semiconductor layer 244 may be located at a first proximal well depth d_pw1. The interface between the second proximal doped semiconductor layer 244 and the third proximal doped semiconductor layer 246 may be located at a second proximal well depth d_pw2. The interface between the third proximal doped semiconductor layer 246 and the drift-region well 22 may be located at a third proximal well depth d_pw3. In one embodiment, the variable atomic concentration profile has a peak atomic concentration ppac for the dopants of the second conductivity type at a depth, which is herein referred to as a proximal peak concentration depth d_ppc. In one embodiment, the variable atomic concentration profile may have a first local minimum LM1' at an interface between the first proximal doped semiconductor layer 242 and the second proximal doped semiconductor layer 244, and may have a second local minimum LM2' at an interface between the second proximal doped semiconductor layer 244 and the third proximal doped semiconductor layer 246.

In one embodiment, each set of proximal doped semiconductor layers (242, 244, 246) may comprise, from top to bottom, a first proximal doped semiconductor layer 242 including atoms of the dopants of the second conductivity type at a first average proximal atomic concentration, a second proximal doped semiconductor layer 244 including atoms of the dopants of the second conductivity type at a second average proximal atomic concentration, and a third proximal doped semiconductor layer 246 including atoms of the dopants of the second conductivity type at a third average proximal atomic concentration. In one embodiment, the second average proximal atomic concentration is greater than the first average proximal atomic concentration, and the third average proximal atomic concentration is greater than the second average proximal atomic concentration. The average atomic concentration of dopants of the second conductivity type in the drift-region wells 22 is less than the first average proximal atomic concentration. Generally, each proximal doped layer stack 24 may have a variable atomic concentration profile as a function of a depth from a top surface of the semiconductor material layer 6.

The first proximal well depth d_pw1 may be in a range from 20 nm to 300 nm, although lesser and greater depths may also be used. The second proximal well depth d_pw2 may be in a range from 120 nm to 500 nm, although lesser and greater depths may also be used. The third proximal well depth d_pw3 may be in a range from 160 nm to 700 nm, although lesser and greater depths may also be used. The interface between the third proximal doped semiconductor layer 246 and the drift-region well 22 may be located below the horizontal plane including the bottom surface of the first portion 12A of the shallow trench isolation structure 12. In one embodiment, the interface between the second proximal doped semiconductor layer 244 and the third proximal doped semiconductor layer 246 may be located below the horizontal plane including the bottom surface of the first portion 12A of the shallow trench isolation structure 12. In one embodiment, the interface between the first proximal doped semiconductor layer 242 and the second proximal doped semiconductor layer 244 may be located below the horizontal plane including the bottom surface of the first portion 12A of the shallow trench isolation structure 12.

Generally, each proximal doped layer stack 24 may be embedded within a drift-region well 22, and may be interposed between a source-side doped well 23 and a first portion 12A of the shallow trench isolation structure 12. The proximal doped layer stack 24 is laterally spaced from a p-n junction between the source-side doped well 23 and the drift-region well 22. In one embodiment, the distal peak concentration depth d_dpc at which the vertical dopant concentration profile of the distal doped layer stack 26 is at a maximum may be located above a horizontal plane including a bottommost surface of the proximal doped layer stack 24.

Figure 9A:
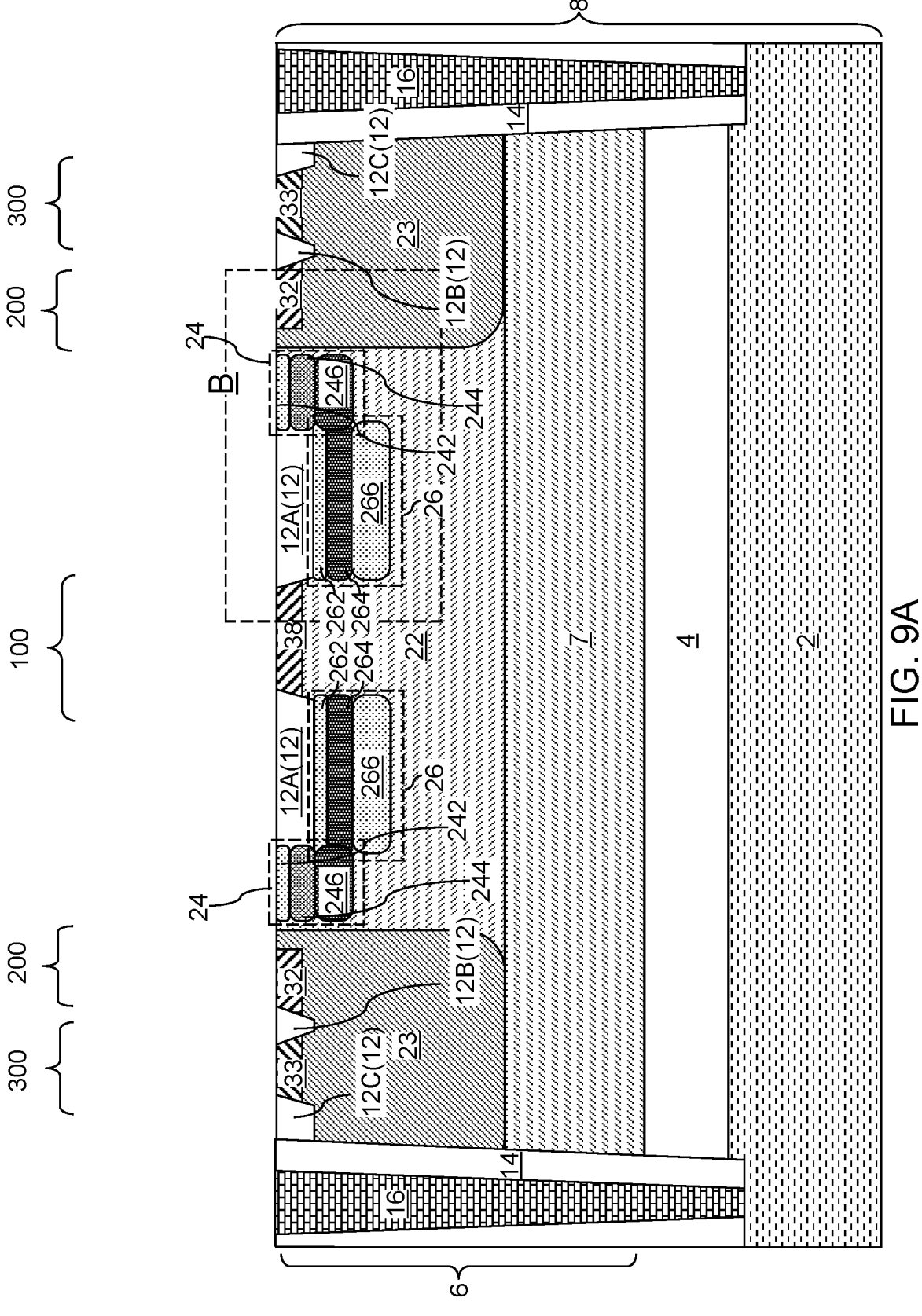
FIG. 9A is a vertical cross-sectional view of the intermediate structure after formation of a drain region, source regions, and body contact regions according to an embodiment of the present disclosure.
Figure 9B:
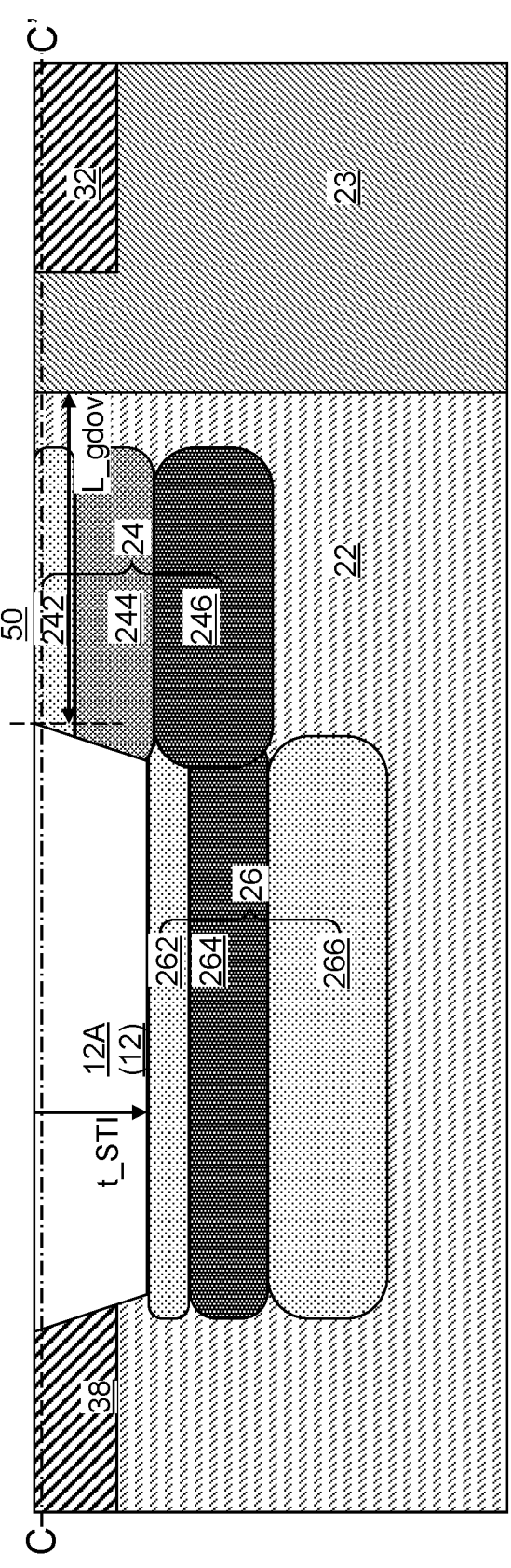
FIG. 9B is a magnified view of region B of FIG. 9A.
Figure 9C:
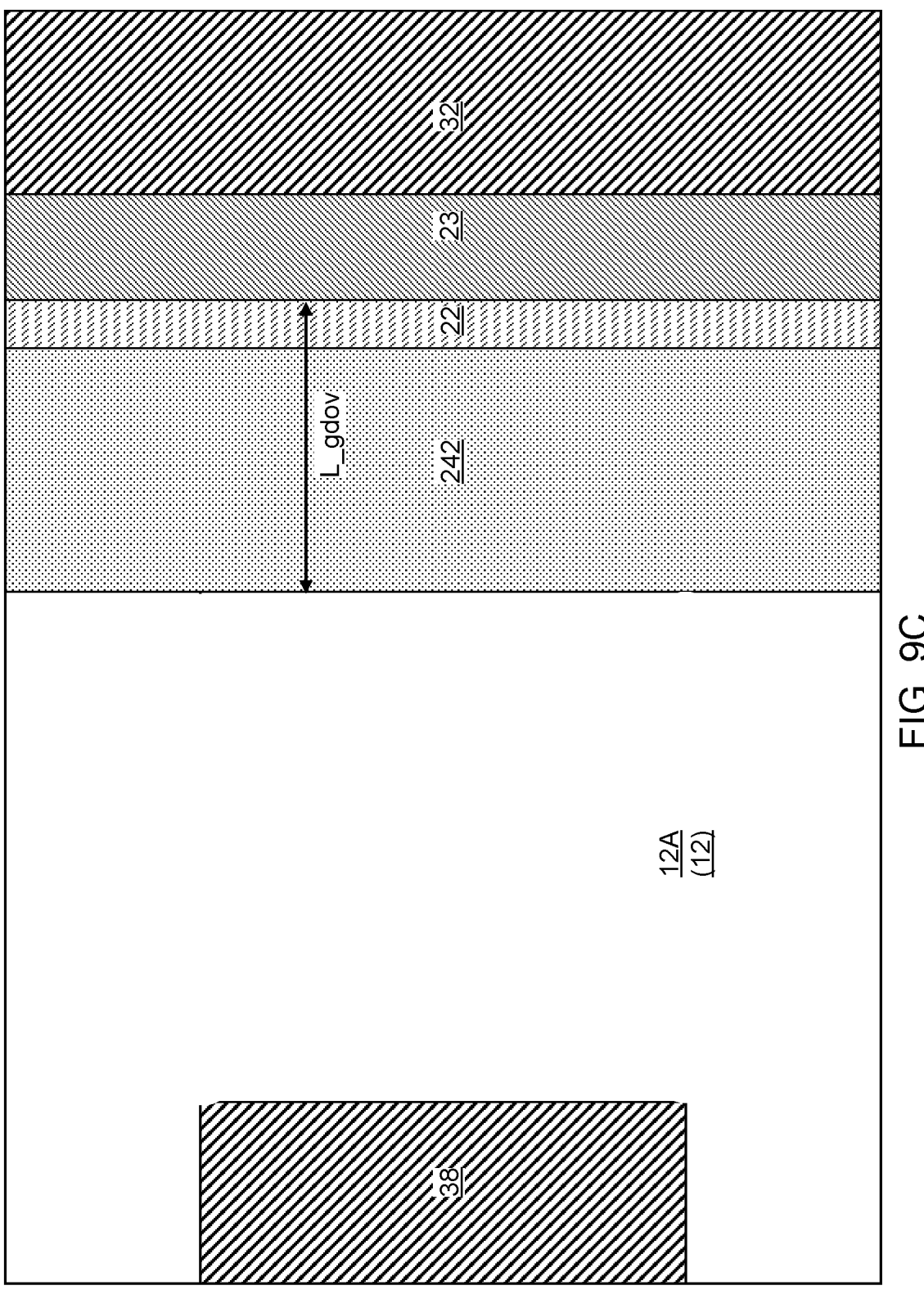
FIG. 9C is a horizontal cross-sectional view along the horizontal plane C-C' of FIG. 9B.

Referring to FIGS. 9A-9C, a first masked ion implantation process may be subsequently performed to implant dopants of the second conductivity type. For example, a first implantation mask (not shown) may be formed over the substrate 8, and may be patterned to form an opening within the drain area 100 and to form an opening within each source area 200. The first implantation mask may be a patterned photoresist layer. Dopants of the second conductivity type may be implanted into unmasked portions of the source-side doped well 23 (which has a doping of the first conductivity type) and into unmasked portions of the drift-region well 22. The implanted surface portion of the drift-region well 22 is converted into a drain region 38. Each implanted surface portion of the source-side doped well 23 is converted into a source region 32.

Each source region 32 and the drain region 38 have a doping of the second conductivity type. The net dopant concentration (i.e., the atomic concentration of dopants of the second conductivity type less the atomic concentration of dopants of the first conductivity type) in each source region 32 and the drain region 38 may be in range from $3\times10^{19}/cm^3$ to $2\times10^{21}/cm^3$, such as from $1\times10^{20}/cm^3$ to $1\times10^{21}/cm^3$, and/or from $2\times10^{20}/cm^3$ to $6\times10^{20}/cm^3$, although lesser and greater net dopant concentrations may also be used. The first implantation mask may be subsequently removed, for example, by ashing.

A second masked ion implantation process may be performed to implant dopants of the first conductivity type. For example, a second implantation mask (not shown) may be formed over the substrate 8, and may be patterned to form an opening within each body contact area 300. The second implantation mask may be a patterned photoresist layer. Dopants of the first conductivity type may be implanted into unmasked portions of the source-side doped well 23 (which has a doping of the first conductivity type). The implanted surface portion of the source-side doped well 23 is converted into a body contact region 33.

Each body contact region 33 has a doping of the first conductivity type. The net dopant concentration (i.e., the atomic concentration of dopants of the first conductivity type less the atomic concentration of dopants of the second conductivity type) in each body contact region 33 may be in range from $3\times10^{19}/cm^3$ to $2\times10^{21}/cm^3$, such as from $1\times10^{20}/cm^3$ to $1\times10^{21}/cm^3$, and/or from $2\times10^{20}/cm^3$ to $6\times10^{20}/cm^3$, although lesser and greater net dopant concentrations may also be used. The second implantation mask may be subsequently removed, for example, by ashing.

The collection of all doped semiconductor regions (7, 22, 23, 24, 26, 32, 33, 38) overlying the buried insulating layer 4 constitutes the semiconductor material layer 6. In one embodiment, the semiconductor material layer 6 comprises an drift-region well 22 formed between the source-side doped well 23 and the drain region 38 and having a doping of the second conductivity type and contacting a first segment of a horizontal bottom surface of the shallow trench isolation structure 12, which may be a first segment of a horizontal bottom surface of the first shallow trench isolation portion 12A. In one embodiment, the semiconductor material layer 6 comprises a drift-region well 22 having a doping of the second conductivity type, contacting a bottom surface of the drain region 38, and contacting a sidewall of the drift-region well 22 and a second segment of the horizontal bottom surface of the shallow trench isolation structure 12, which may be a second segment of the horizontal bottom surface of the first shallow trench isolation portion 12A. The drift-region well 22 may contact a sidewall of the source-side doped well 23. The drain region 38 may be laterally spaced from the source-side doped well 23 by the drift-region well 22. The buried doped semiconductor layer 7 may have a doping of the first conductivity type, and may contact a bottom surface of the source-side doped well 23 and a bottom surface of the drift-region well 22.

Generally, the semiconductor material layer 6 includes a source-side doped well 23 having a doping of a first conductivity type, a drift-region well 22 having a doping of a second conductivity type that is an opposite of the first conductivity type, a source region 32 having a doping of the second conductivity type and embedded in the source-side doped well 23, a drain region 38 having a doping of the second conductivity type and embedded in the drift-region well 22. A distal doped layer stack 26 may be embedded within the drift-region well 22, may underlie the first portion 12A of the shallow trench isolation structure 12, may be interposed between the proximal doped layer stack 24 and the drain region 38, and may comprise a set of distal doped semiconductor layers (262, 264, 266).

Figure 10A:
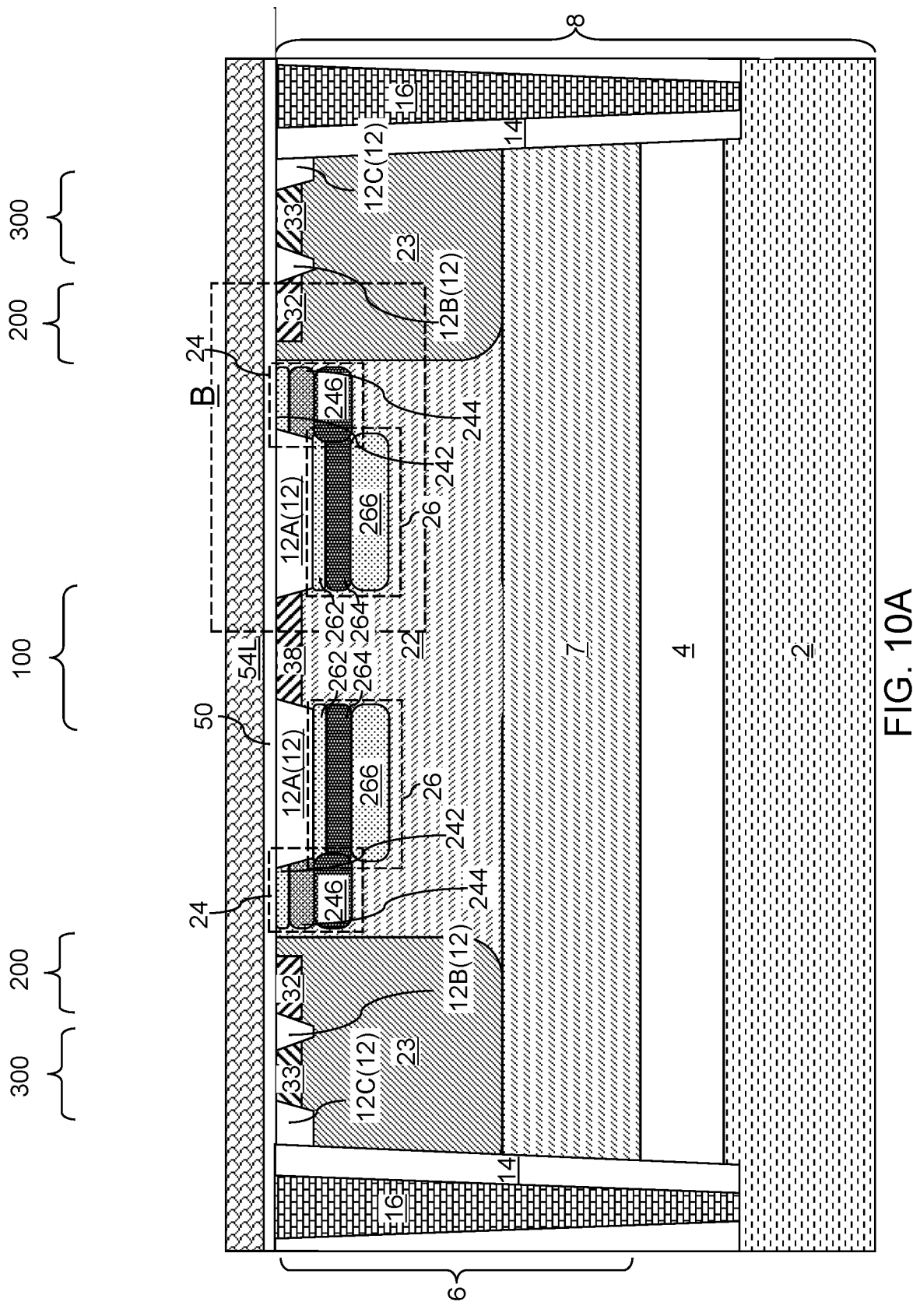
FIG. 10A is a vertical cross-sectional view of the intermediate structure after formation of a gate dielectric layer and a gate electrode layer through an upper portion of a shallow trench isolation structure according to an embodiment of the present disclosure.
Figure 10B:
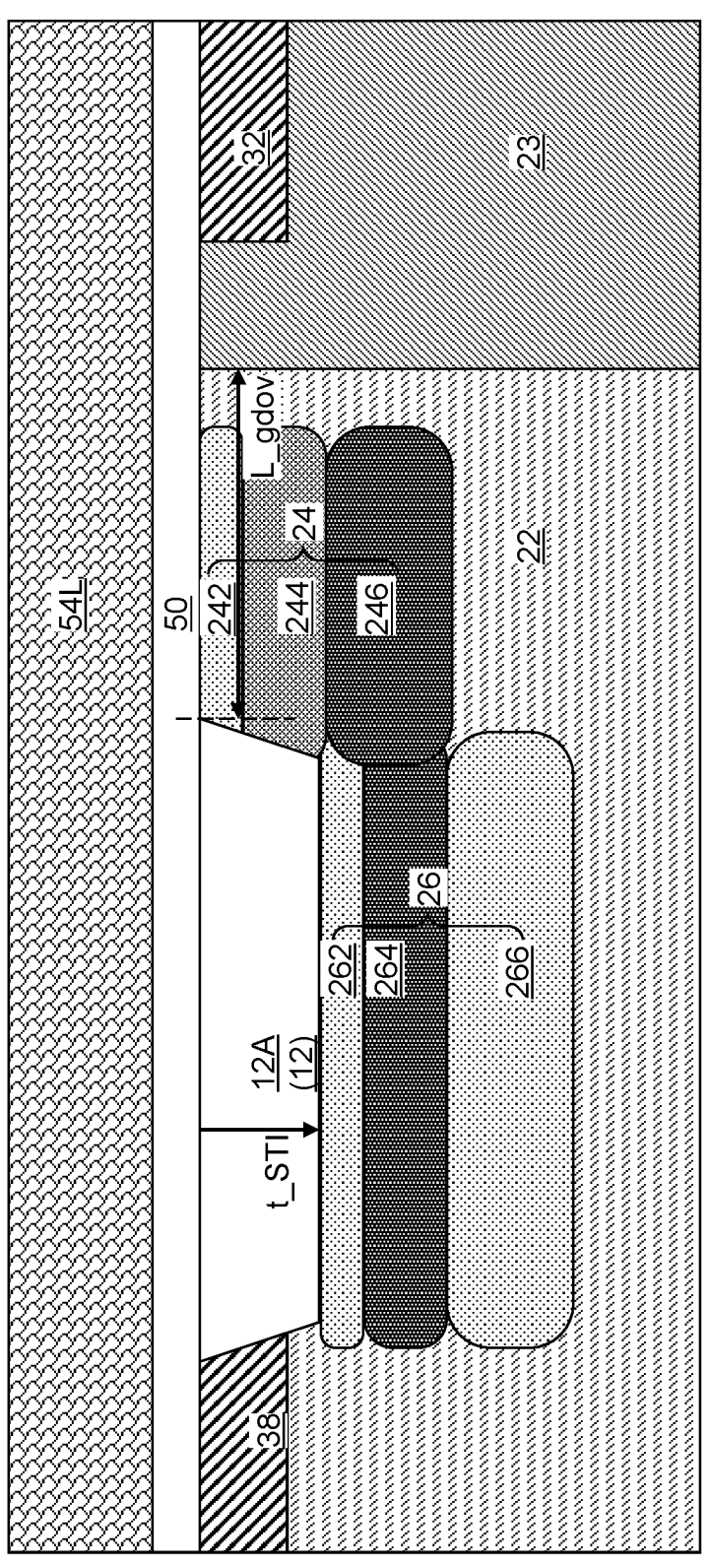
FIG. 10B is a magnified view of region B of FIG. 10A.

Referring to FIGS. 10A and 10B, a gate dielectric layer 50 may be formed over the semiconductor material layer 6 and the shallow trench isolation structure 12. The gate dielectric layer 50 may be formed by deposition of a gate dielectric material and/or by thermal conversion of a top surface portion of the semiconductor material layer 6. In embodiments in which the gate dielectric layer 50 is formed by deposition of a gate dielectric material (such as silicon oxide and/or at least one dielectric metal oxide material (e.g., aluminum oxide, hafnium oxide, lanthanum oxide, titanium oxide, tantalum oxide, etc.)), the gate dielectric layer 50 may include a continuous blanket material layer that continuously extends over the entire top surface of the substrate 8. In embodiments in which the gate dielectric layer 50 is formed by thermal conversion (such as thermal oxidation) of a top surface portion of the semiconductor material layer 6, the gate dielectric layer 50 may be formed only on the physically exposed semiconductor surfaces of the top surface portion of the semiconductor material layer 6, i.e., in areas that are not covered by the shallow trench isolation structure 12 and the deep trench isolation structure 14. Generally, any gate dielectric material known in the art may be used for the gate dielectric layer 50. The thickness of the gate dielectric layer 50 depends on the operating voltage of the field effect transistor to be formed, and may be, for example, in a range from 10 nm to 100 nm, such as from 15 nm to 60 nm, although lesser and greater thicknesses may also be used. The gate dielectric layer 50 laterally extends between the top surface of the source-side doped well 23 and the first portion 12A of the shallow trench isolation structure 12. In one embodiment, each first proximal doped semiconductor layer 242 contacts the bottom surface of the gate dielectric layer 50.

A gate electrode layer 54L may be deposited over the gate dielectric layer 50 by a conformal deposition process such as a chemical vapor deposition process. The gate electrode layer 54L includes a conductive material such as heavily-doped polysilicon and/or at least one metallic material (such as a combination of a metallic barrier liner including a conductive metallic nitride material and a metallic fill material such as W, Ta, Ti, Co, Ru, Mo, etc.). The thickness of the gate electrode layer 54L may be in a range from 100 nm to 300 nm, such as from 150 nm to 250 nm, although lesser and greater thicknesses may also be used.

Figure 11A:
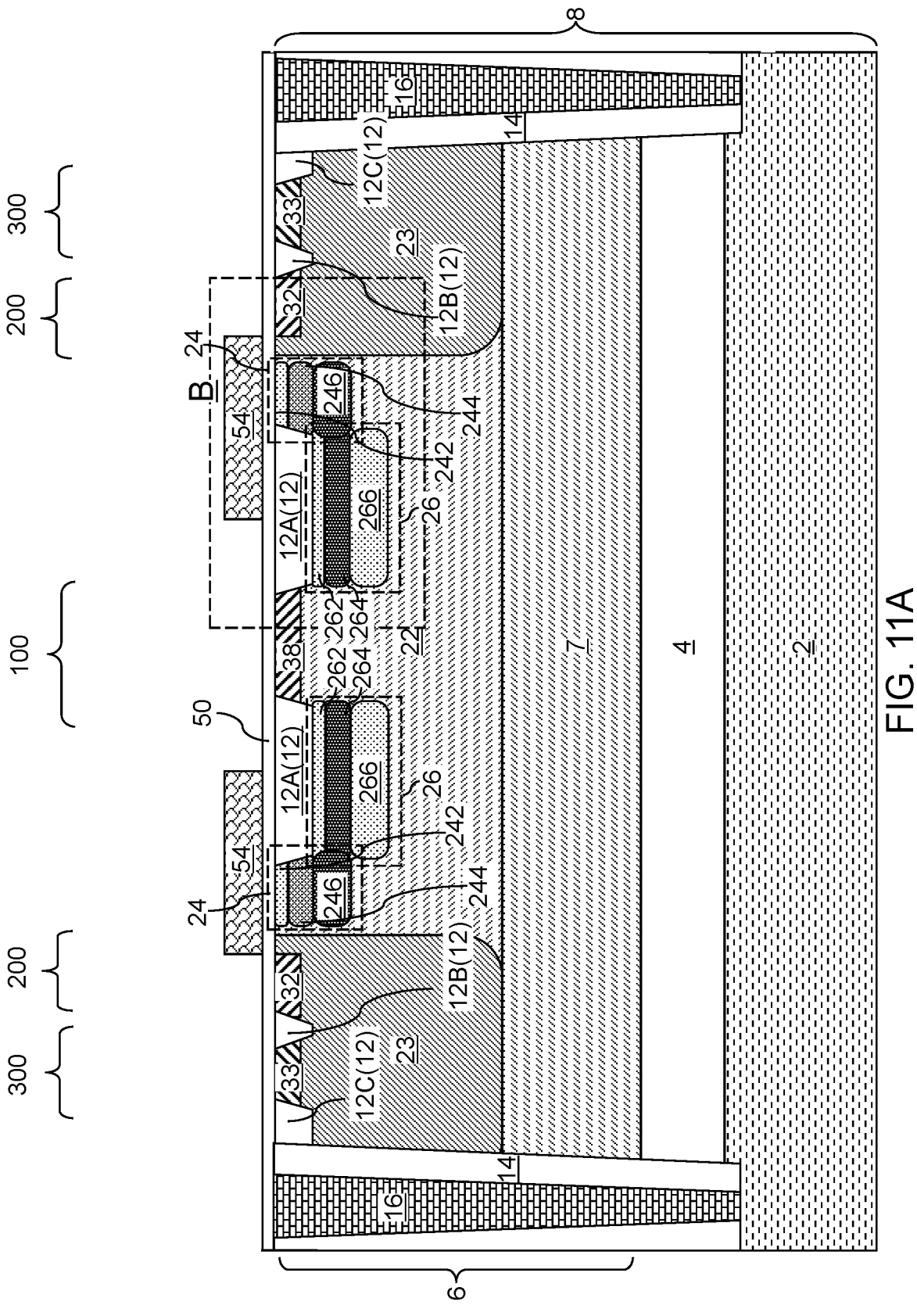
FIG. 11A is a vertical cross-sectional view of the intermediate structure after formation of gate electrodes according to an embodiment of the present disclosure.
Figure 11B:
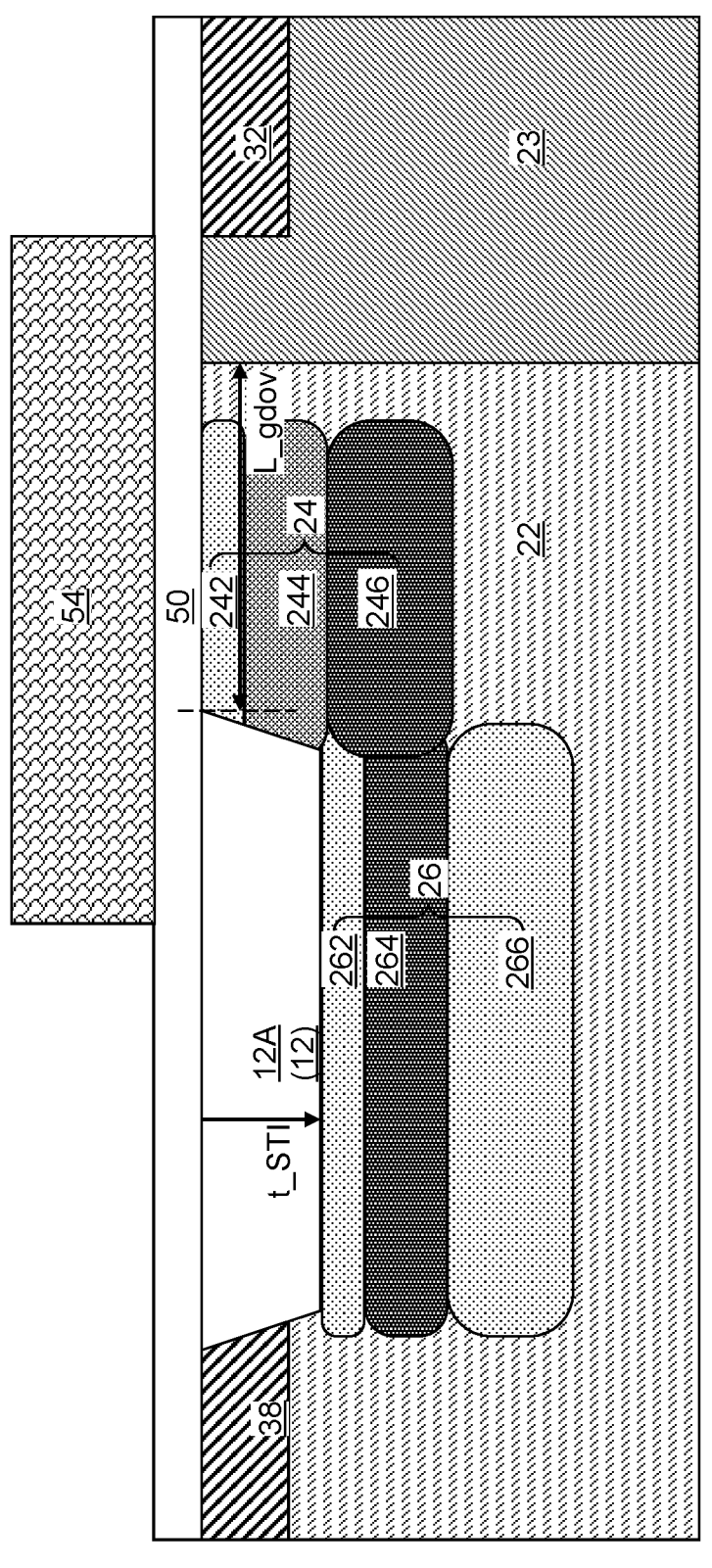
FIG. 11B is a magnified view of region B of FIG. 11A.

Referring to FIGS. 11A and 11B, a photoresist layer (not shown) may be applied over the gate electrode layer 54L, and may be lithographically patterned to cover an area in which a gate electrode 54 is to be subsequently formed. Unmasked portions of the gate electrode layer 54L may be removed by performing an anisotropic etch process that uses the patterned photoresist layer as an etch mask. A patterned portion of the gate electrode layer 54L constitutes a gate electrode 54.

In one embodiment, the source region 32 and the drain region 38 may be laterally spaced apart along a first horizontal direction, and a sidewall of the source region 32 contacting the source-side doped well 23 may be parallel to a second horizontal direction that is perpendicular to the first horizontal direction. The lateral distance of a surface portion of the source-side doped well 23 located between an interface between the source-side doped well 23 and the source region 32 and an interface between the source-side doped well 23 and the drift-region well 22 constitutes a channel region. The gate-drain overlap distance L_gdov may be in a range from 400 nm to 100,000 nm, such as from 1,000 nm to 10,000 nm, although lesser and greater dimensions may also be used.

Figure 12A:
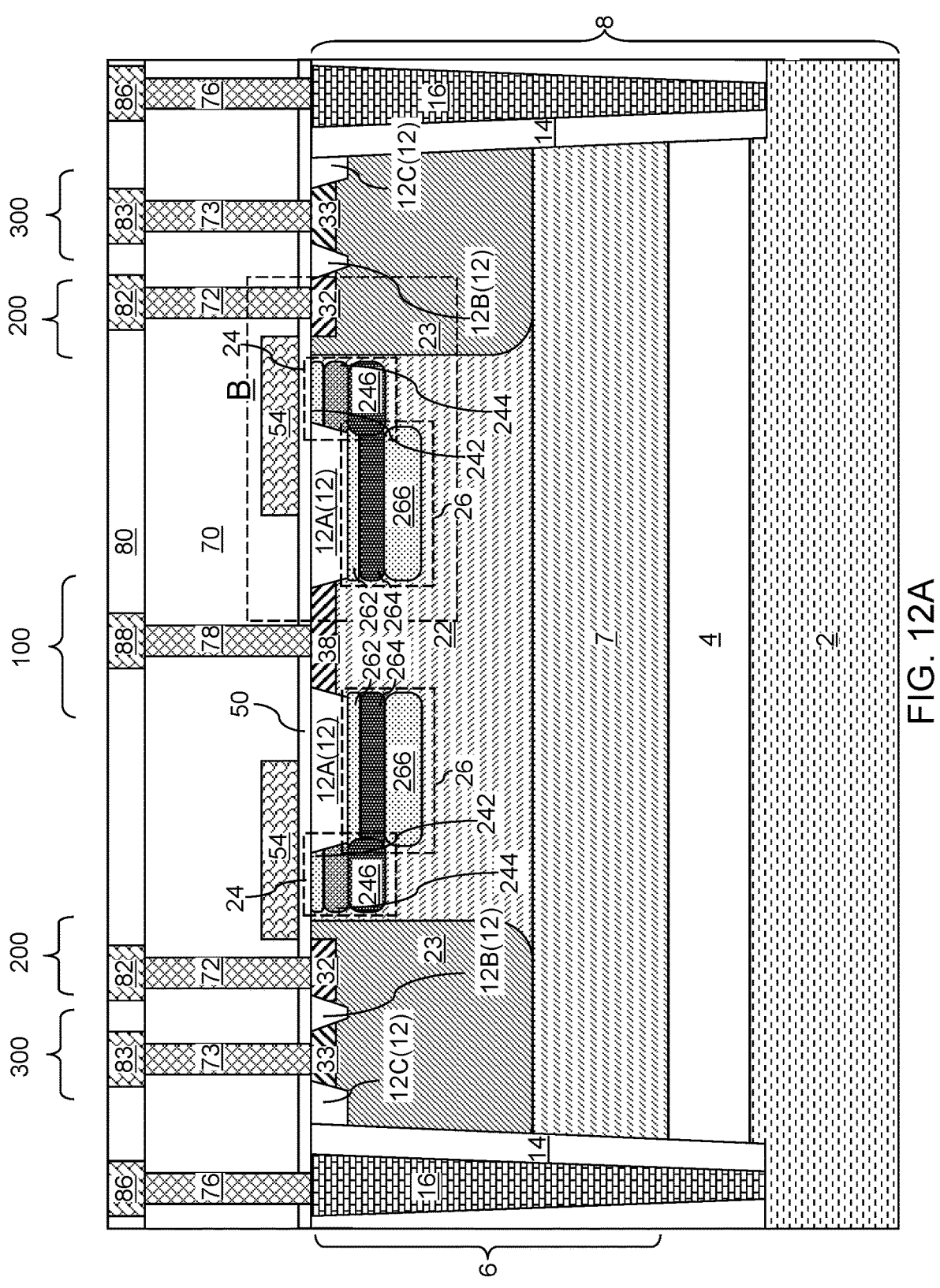
FIG. 12A is a vertical cross-sectional view of the intermediate structure after formation of a planarization dielectric layer, contact via structures, a line-level dielectric layer, and metal lines according to an embodiment of the present disclosure.
Figure 12B:
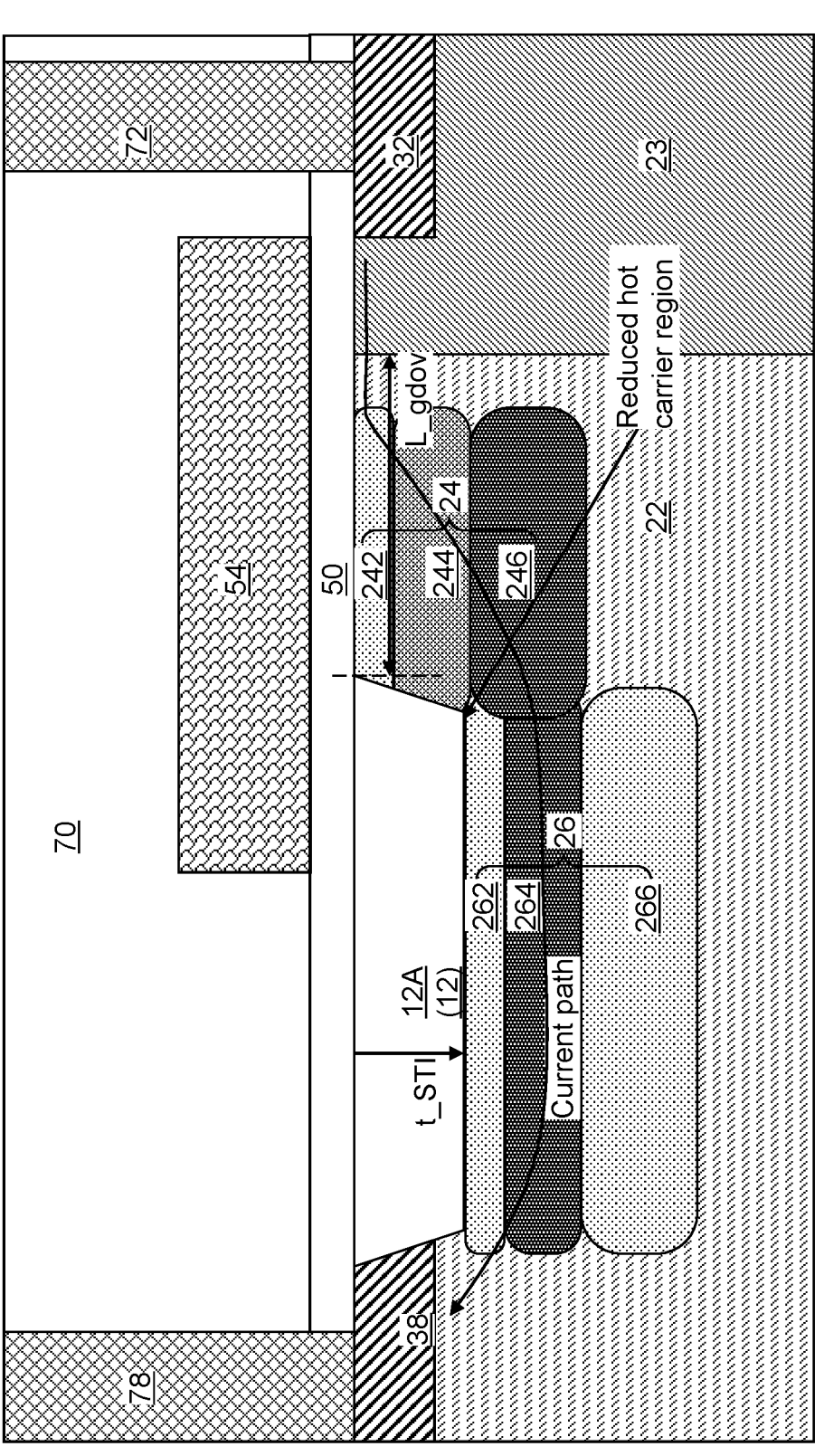
FIG. 12B is a magnified view of region B of FIG. 12A.

Referring to FIGS. 12A and 12B, a planarization dielectric layer 70 including a planarizable dielectric material such as silicon oxide may be deposited over the substrate 8 and each gate electrode 54. The top surface of the planarization dielectric layer 70 may be planarized, for example, by chemical mechanical polishing. Various contact via structures (72, 78, 73, 76) may be formed through the planarization dielectric layer 70 on a top surface of a respective conductive structure. For example, a source contact via structure 72 may be formed on a top surface of each source region 32. A drain contact via structure 78 may be formed on a top surface of the drain region 38. A body contact via structure 73 may be formed on a top surface of each body contact region 33. A substrate connection via structure 76 may be formed on a top surface of each substrate contact via structure 16.

A line-level dielectric layer 80 may be deposited over the planarization dielectric layer 70, and various metal lines (82, 88, 83, 86) may be formed in the line-level dielectric layer 80. For example, the metal lines (82, 88, 83, 86) may include at least one source connection metal line 82 contacting a top surface of a respective source contact via structure 72, a drain connection metal line 88 contacting a top surface of the drain contact via structure 78, at least one body connection metal line 83 contacting a top surface of a respective body contact via structure 73, and at least one substrate connection metal line 86 contacting a top surface of a respective substrate connection via structure 76.

According to an aspect of the present disclosure, the proximal doped layer stack 24 and the distal doped layer stack 26 guide the channel current of the field effect transistor of the present disclosure along a current path (such as the current path illustrated in FIG. 12B) that is shifted downward from surface portions of the semiconductor material layer 6 that are proximal to the gate dielectric layer 50 and the shallow trench isolation structure 12, and prevents hot carrier injection into the shallow trench isolation structure 12.

Figure 13:
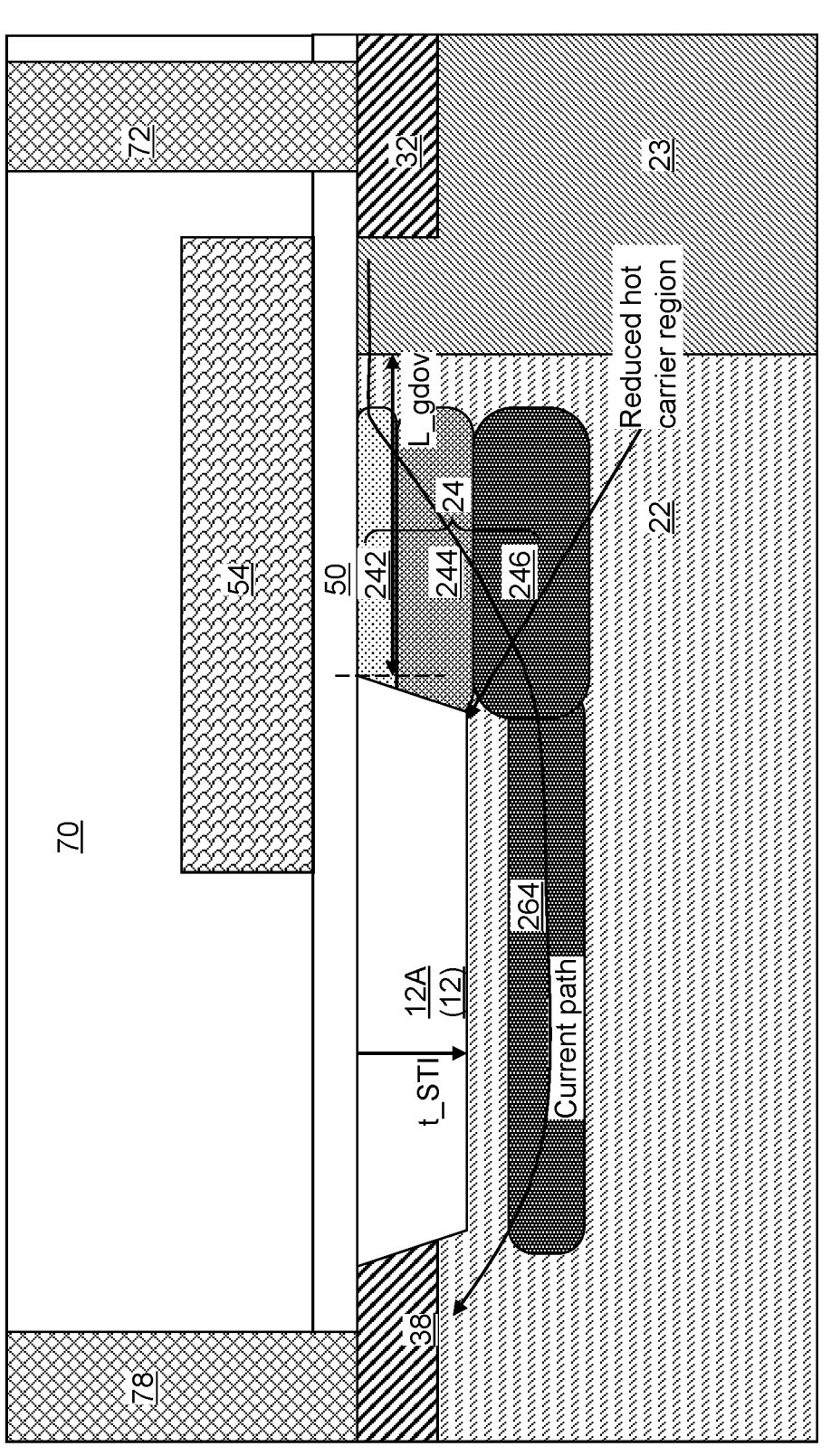
FIG. 13 is a vertical cross-sectional view of a first alternative configuration of the structure according to an embodiment of the present disclosure.

Referring to FIG. 13, a first alternative configuration of the structure may be derived from the structure illustrated in FIGS. 12A and 12B by modifying the distal doped layer stack 26 to omit the first distal doped semiconductor layer 262 and/or the third distal doped semiconductor layer 266. Thus, only the first distal doped semiconductor layer 262 may be omitted, only the third distal doped semiconductor layer 266 may be omitted, or both the first distal doped semiconductor layer 262 and the third distal doped semiconductor layer 266 may be omitted. In this embodiment, ion implantation step(s) for forming the first distal doped semiconductor layer 262 and/or the third distal doped semiconductor layer 266 may be omitted. The second distal doped semiconductor layer 264 functions as a guide structure that guides the channel current downward away from the bottom surface of the shallow trench isolation structure 12. The third proximal doped semiconductor layer 246 functions as a current guide structure as in the structure of FIGS. 12A and 12B. The first proximal doped semiconductor layer 242 and the second proximal doped semiconductor layer 244 facilitates spread of electrical current into the third proximal doped semiconductor layer 246 by providing a gradual change in the vertical dopant concentration profile of the dopants of the second conductivity type.

Figure 14:
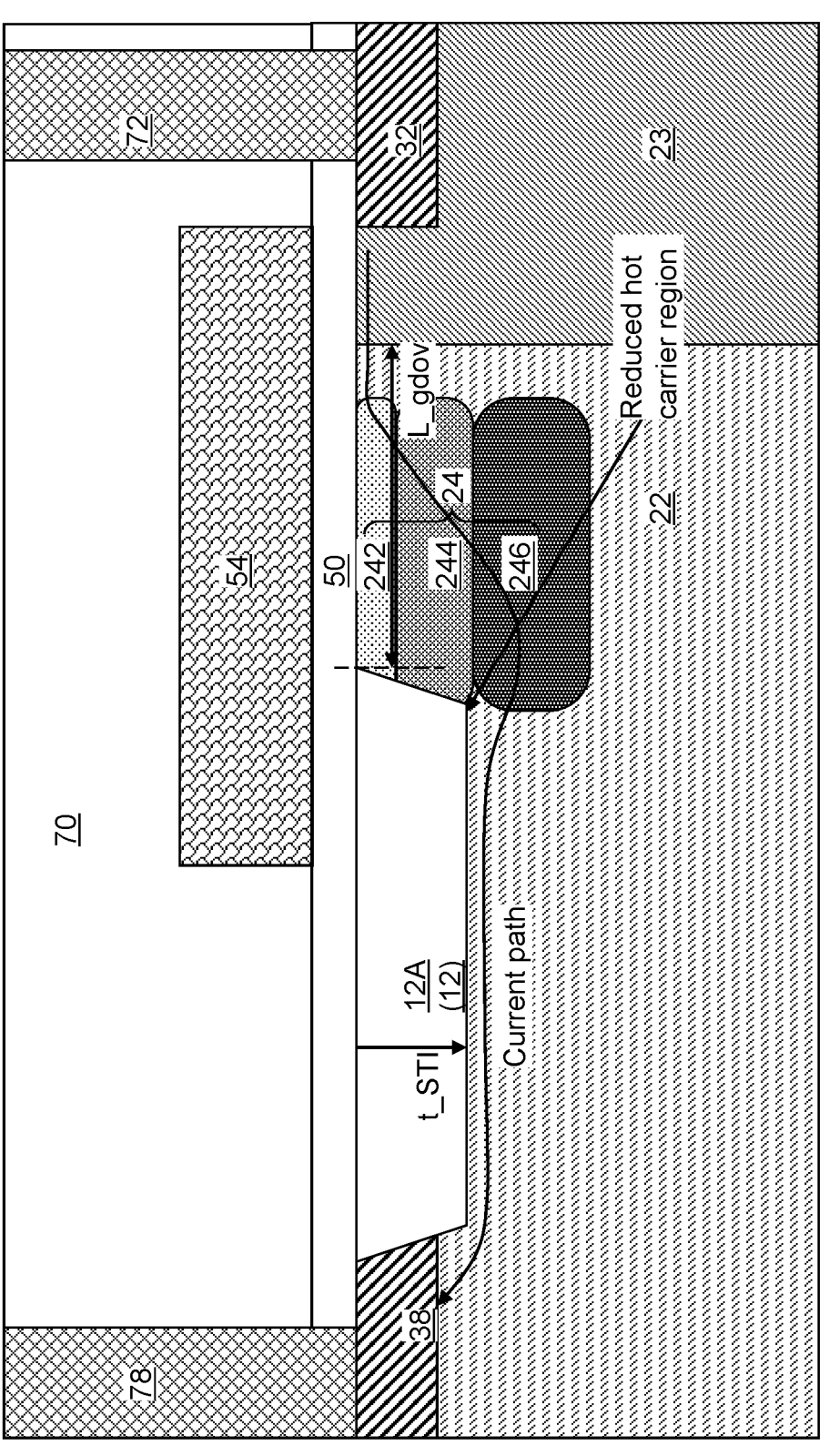
FIG. 14 is a vertical cross-sectional view of a second alterative configuration of the structure according to an embodiment of the present disclosure.

Referring to FIG. 14, a second alternative configuration of the structure may be derived from the structure illustrated in FIGS. 12A and 12B by omitting formation of the distal doped layer stack 26. In this embodiment, the third proximal doped semiconductor layer 246 functions as a current guide structure as in the structure of FIGS. 12A and 12B. The first proximal doped semiconductor layer 242 and the second proximal doped semiconductor layer 244 facilitates spread of electrical current into the third proximal doped semiconductor layer 246 by providing a gradual change in the vertical dopant concentration profile of the dopants of the second conductivity type. The path of the channel current shifts away from a bottom corner of the shallow trench isolation structure 12 that is labeled as "Reduced hot carrier region," which is exposed to less hot carriers due to the modification of the path of the channel current.

Referring to FIG. 15, a first flow chart illustrates a general sequence of processing steps that may be used to form a high voltage field effect transistor of the present disclosure.

Referring to step 1510 and FIGS. 3 and 5A and 5B, a shallow trench isolation structure 12 is formed in an upper portion of a semiconductor material layer 6.

Referring to step 1520 and FIGS. 1, 2, 4A-4C, 6-8C, 13, and 14, doped semiconductor regions are formed in the semiconductor material layer 6. The doped semiconductor regions comprise a source-side doped well 23 having a doping of a first conductivity type, a source region 32 having a doping of a second conductivity type that is an opposite of the first conductivity type and embedded in the source-side doped well 23, a drain region 38 having a doping of the second conductivity type and laterally spaced from the source region 32 by the shallow trench isolation structure 12, and a proximal doped layer stack 24 interposed between the source-side doped well 23 and the shallow trench isolation structure 12 and comprising a set of proximal doped semiconductor layers (242, 244, 246). The proximal doped layer stack 24 has a variable atomic concentration profile as a function of a depth from a top surface of the semiconductor material layer 6.

Referring to step 1530 and FIGS. 9A-9C, 13, and 14, a gate dielectric layer 50 may be formed over the doped semiconductor regions.

Referring to step 1540 and FIGS. 9A-14, a gate electrode 54 may be formed over the gate dielectric layer 50.

Referring to FIG. 16, a second flow chart illustrates a general sequence of processing steps that may be used to form a high voltage field effect transistor of the present disclosure.

Referring to step 1610 and FIGS. 3 and 5A and 5B, a shallow trench isolation structure 12 is formed in an upper portion of a semiconductor material layer 6.

Referring to step 1620 and FIGS. 1, 2, 4A-4C, 6-8C, 13, and 14, doped semiconductor regions are formed in the semiconductor material layer 6. The doped semiconductor regions comprise a source-side doped well 23 having a doping of a first conductivity type, a drift-region well 22 having a doping of a second conductivity type that is an opposite of the first conductivity type, a source region 32 having a doping of the second conductivity type, a drain region 38 having a doping of the second conductivity type, and a proximal doped layer stack 24 comprising a set of proximal doped semiconductor layers (242, 244, 246) and formed within the drift-region well 22 and between the source-side doped well 23 and the shallow trench isolation structure 12. The proximal doped semiconductor layers (242, 244, 246) have different average atomic concentrations of dopants of the second conductivity type thereamongst.

Referring to step 1630 and FIGS. 9A-9C, 13, and 14, a gate dielectric layer 50 may be formed over a top surface of the source-side doped well 23 and the shallow trench isolation structure 12.

Referring to step 1640 and FIGS. 9A-14, a gate electrode 54 may be formed over the gate dielectric layer 50.

Referring to FIG. 17, a third flow chart illustrates a general sequence of processing steps that may be used to form a high voltage field effect transistor of the present disclosure.

Referring to step 1710 and FIGS. 3 and 5A and 5B, a shallow trench isolation structure 12 may be formed in an upper portion of a semiconductor material layer 6.

Referring to step 1720 and FIGS. 1, 2, 4A-4C, 6-8C, 13, and 14, doped semiconductor regions may be formed in the semiconductor material layer 6. The doped semiconductor regions comprise a source-side doped well 23 having a doping of a first conductivity type, a drift-region well 22 having a doping of a second conductivity type that is an opposite of the first conductivity type, a source region 32 having a doping of the second conductivity type, and a drain region 38 having a doping of the second conductivity type. The shallow trench isolation structure 12 is laterally spaced from a p-n junction between the source-side doped well 23 and the drift-region well 22 by a gate-drain overlap distance L_gdov, the shallow trench isolation structure 12 has a shallow trench isolation thickness t_STI, and a ratio of the gate-drain overlap distance L_gdov to the shallow trench isolation thickness t_STI is in a range from 3 to 100.

Referring to step 1730 and FIGS. 9A-9C, 13, and 14, a gate dielectric layer 50 may be formed over a top surface of the source-side doped well 23 and the shallow trench isolation structure 12.

Referring to step 1740 and FIGS. 9A-14, a gate electrode 54 may be formed over the gate dielectric layer 50.

In one embodiment method, the semiconductor material layer 6 may include a drift-region well 22 formed between the source-side doped well 23 and the drain region 38 and having a doping of the second conductivity type; and the proximal doped semiconductor layers 24 may be formed within the drift-region well 22 and may be laterally spaced from the source-side doped well 23. In one embodiment method, the variable atomic concentration profile has a peak atomic concentration for the dopants of the second conductivity type at a depth that is greater than a thickness of the first portion of the shallow trench isolation structure 12. In one embodiment, the method may also include the step of forming a distal doped layer stack 26 in the semiconductor material layer 6 underneath the shallow trench isolation structure 12 between the proximal doped layer stack 24 and the drain region 38, and may include a set of distal doped semiconductor layers 26, wherein the distal doped semiconductor layers have different average atomic concentrations of additional dopants of the second conductivity type. In one embodiment method, the shallow trench isolation structure 12 may be laterally spaced from a p-n junction between the source-side doped well 23 and the drift-region well 22 by a gate-drain overlap distance L_gdov; the shallow trench isolation structure 12 may have a shallow trench isolation thickness t_STI; and a ratio of the gate-drain overlap distance L_gdov to the shallow trench isolation thickness t_STI may be in a range from 3 to 100.

According to another aspect of the present disclosure, a method of forming field effect transistor is provided, which may include: forming a shallow trench isolation structure 12 in an upper portion of a semiconductor material layer 6; forming doped semiconductor regions 22, 23 in the semiconductor material layer 6, wherein the doped semiconductor regions 22, 23 may include a source-side doped well 23 having a doping of a first conductivity type, a drift-region well 22 having a doping of a second conductivity type that is an opposite of the first conductivity type, a source region 32 having a doping of the second conductivity type, a drain region 38 having a doping of the second conductivity type, and a proximal doped layer stack 24 that may include a set of proximal doped semiconductor layers (242, 244, 246) and formed within the drift-region well 22 and between the source-side doped well 23 and the shallow trench isolation structure 12, wherein the proximal doped semiconductor layers (242, 244, 246) have different average atomic concentrations of dopants of the second conductivity type thereamongst; forming a gate dielectric layer 50 over a top surface of the source-side doped well 23 and the shallow trench isolation structure 12; and forming a gate electrode 54 overlying the gate dielectric layer 50. In one embodiment method, the proximal doped layer stack 24 may be formed with a variable atomic concentration profile as a function of a depth from a top surface of the semiconductor material layer 6; and the variable atomic concentration profile has a peak atomic concentration for the dopants of the second conductivity type at a depth that is greater than a thickness of the first portion of the shallow trench isolation structure 12. In one embodiment method, the set of proximal doped semiconductor layers 24 may include, from top to bottom, a first proximal doped semiconductor layer 242 including atoms of the dopants of the second conductivity type at a first average proximal atomic concentration, a second proximal doped semiconductor layer 244 including atoms of the dopants of the second conductivity type at a second average proximal atomic concentration, and a third proximal doped semiconductor layer 246 including atoms of the dopants of the second conductivity type at a third average proximal atomic concentration; and the third average proximal atomic concentration may be greater than the second average proximal atomic concentration. In one embodiment method, the second average proximal atomic concentration is greater than the first average proximal atomic concentration; and an average atomic concentration of dopants of the second conductivity type in the drift-region well 22 may be less than the first average proximal atomic concentration. In one embodiment method, the proximal doped layer stack 24 may be laterally spaced from a p-n junction between the source-side doped well 23 and the drift-region well 22; and the gate dielectric layer 50 may be formed on a top surface of the first proximal doped semiconductor layer 24. In one embodiment method, the method may include forming a distal doped layer stack 26 within the drift-region well 22 under the shallow trench isolation structure 12 between the proximal doped layer stack 24 and the drain region 38, wherein the distal doped layer stack 26 may include a set of distal doped semiconductor layers (262, 264, 266) having different average atomic concentrations of additional dopants of the second conductivity type. In one embodiment method, the method may include forming a shallow trench 12 in the upper portion of the semiconductor material layer 6, wherein the distal doped layer stack 26 may be formed by a set of ion implantation processes using a same ion implantation mask after formation of the shallow trench 12 and prior to formation of the shallow trench isolation structure 12. In one embodiment, the distal doped layer stack 26 may have a variable atomic concentration profile as a function of a depth from a bottom surface of the first portion of the shallow trench isolation structure 12; and the variable atomic concentration profile may have a peak atomic concentration for the additional dopants of the second conductivity type at a depth that is located above a horizontal plane including a bottommost surface of the proximal doped layer stack 24. In one embodiment, the set of distal doped semiconductor layers 26 may include, from top to bottom, a first distal doped semiconductor layer 262 including atoms of the additional dopants of the second conductivity type at a first average distal atomic concentration, a second distal doped semiconductor layer 264 including atoms of the additional dopants of the second conductivity type at a second average distal atomic concentration, and a third distal doped semiconductor layer 266 including atoms of the additional dopants of the second conductivity type at a third average distal atomic concentration; and the second average distal atomic concentration is greater than the first average distal atomic concentration. In one embodiment, the second average distal atomic concentration may be greater than the third average distal atomic concentration; and an average atomic concentration of dopants of the second conductivity type in the drift-region well 22 may be less than the third average distal atomic concentration. In one embodiment, the shallow trench isolation structure 12 may be laterally spaced from a p-n junction between the source-side doped well 23 and the drift-region well 22 by a gate-drain overlap distance L gdov; the shallow trench isolation structure 12 may have a shallow trench isolation thickness t_STI; and a ratio of the gate-drain overlap distance L_gdov to the shallow trench isolation thickness t_STI may be in a range from 2.5 to 1,000.

According to another aspect of the present disclosure, a method of forming field effect transistor is provided, which may include: forming a shallow trench isolation structure 12 in an upper portion of a semiconductor material layer 6; forming doped semiconductor regions in the semiconductor material layer 6, wherein the doped semiconductor regions comprise a source-side doped well 23 having a doping of a first conductivity type, a drift-region well 22 having a doping of a second conductivity type that is an opposite of the first conductivity type, a source region 200 having a doping of the second conductivity type, and a drain region 100 having a doping of the second conductivity type, wherein the shallow trench isolation structure 12 may be laterally spaced from a p-n junction between the source-side doped well 23 and the drift-region well 22 by a gate-drain overlap distance L_gdov, the shallow trench isolation structure has a shallow trench isolation thickness t_STI, and a ratio of the gate-drain overlap distance L_gdov to the shallow trench isolation thickness t_STI may be in a range from 3 to 100; forming a gate dielectric layer 50 over a top surface of the source-side doped well 23 and over the shallow trench isolation structure 12; and forming a gate electrode 54 over the gate dielectric layer 50.

In one embodiment, the method may also include forming a proximal doped layer stack 24 within the drift-region well 22 between the source-side doped well 23 and the shallow trench isolation structure 12, wherein the proximal doped layer stack 24 may include a set of proximal doped semiconductor layers (242, 244, 246) and may have a variable atomic concentration profile as a function of a depth from a top surface of the semiconductor material layer 6. In one embodiment method, the variable atomic concentration profile has a peak atomic concentration for the dopants of the second conductivity type at a depth that is greater than a thickness of the shallow trench isolation structure 12. In one embodiment, the method may also include forming a distal doped layer stack 26 within the drift-region well 22 under the shallow trench isolation structure 12 between the proximal doped layer stack 24 and the drain region 38, wherein the distal doped layer stack 26 may include a set of distal doped semiconductor layers (262, 264, 266), wherein the distal doped layer stack 26 may have an additional variable atomic concentration profile as a function of a depth from a bottom surface of the first portion of the shallow trench isolation structure 12; and the variable atomic concentration profile has a peak atomic concentration for the additional dopants of the second conductivity type at a depth that is located above a horizontal plane including a bottommost surface of the proximal doped layer stack 26.

Referring to all drawings and according to various embodiments of the present disclosure, a field effect transistor is provided, which comprises: a semiconductor material layer 6 including a source-side doped well 23 having a doping of a first conductivity type, a drift-region well 22 having a doping of a second conductivity type that is an opposite of the first conductivity type, a source region 32 having a doping of the second conductivity type and embedded in the source-side doped well 23, a drain region 38 having a doping of the second conductivity type and embedded in the drift-region well 22; a shallow trench isolation structure 12 comprising a first portion 12A overlying the drift-region well 22 and laterally spaced from the source-side doped well 23; a gate dielectric layer 50 laterally extending between a top surface of the source-side doped well 23 and the first portion 12A of the shallow trench isolation structure 12; a gate electrode 54 overlying the gate dielectric layer 50; and a proximal doped layer stack 24 embedded within the drift-region well 22 and interposed between the source-side doped well 23 and the first portion 12A of the shallow trench isolation structure 12 and comprising a set of proximal doped semiconductor layers (242, 244, 246), wherein each of the set of proximal doped semiconductor layers (242, 244, 246) has different average atomic concentrations of dopants of the second conductivity type.

In one embodiment of the field effect transistor, the proximal doped layer stack (242, 244, 246) may have a variable atomic concentration profile as a function of a depth from a top surface of the semiconductor material layer; and the variable atomic concentration profile may have a peak atomic concentration for the dopants of the second conductivity type at a depth that is greater than a thickness of the first portion of the shallow trench isolation structure. In one embodiment of the field effect transistor, the set of proximal doped semiconductor layers (242, 244, 246) may include, from top to bottom, a first proximal doped semiconductor layer 242 including atoms of the dopants of the second conductivity type at a first average proximal atomic concentration, a second proximal doped semiconductor layer 244 including atoms of the dopants of the second conductivity type at a second average proximal atomic concentration, and a third proximal doped semiconductor layer 246 including atoms of the dopants of the second conductivity type at a third average proximal atomic concentration; and the third average proximal atomic concentration may be greater than the second average proximal atomic concentration. In one embodiment of the field effect transistor, the second average proximal atomic concentration may be greater than the first average proximal atomic concentration; and an average atomic concentration of dopants of the second conductivity type in the drift-region well may be less than the first average proximal atomic concentration. In one embodiment of the field effect transistor, the first proximal doped semiconductor layer 242 may contact a bottom surface of the gate dielectric layer 50, and may be laterally spaced from a p-n junction between the source-side doped well 23 and the drift-region well 22. In one embodiment, the field effect transistor may also include a distal doped layer stack 26 embedded within the drift-region well 22, underlying the first portion of the shallow trench isolation structure 12, interposed between the proximal doped layer stack 24 and the drain region 38, and comprising a set of distal doped semiconductor layers (262, 264, 266), wherein the distal doped semiconductor layers have different average atomic concentrations of additional dopants of the second conductivity type. In one embodiment of the field effect transistor, the distal doped layer stack 26 may have a variable atomic concentration profile as a function of a depth from a bottom surface of the first portion of the shallow trench isolation structure; and the variable atomic concentration profile may have a peak atomic concentration for the additional dopants of the second conductivity type at a depth that is located above a horizontal plane including a bottommost surface of the proximal doped layer stack 24. In one embodiment of the field effect transistor, the set of distal doped semiconductor layers 26 may include, from top to bottom, a first distal doped semiconductor layer 262 including atoms of the additional dopants of the second conductivity type at a first average distal atomic concentration, a second distal doped semiconductor layer 264 including atoms of the additional dopants of the second conductivity type at a second average distal atomic concentration, and a third distal doped semiconductor layer 266 including atoms of the additional dopants of the second conductivity type at a third average distal atomic concentration; and the second average distal atomic concentration may be greater than the first average distal atomic concentration. In one embodiment of the field effect transistor, the second average distal atomic concentration may be greater than the third average distal atomic concentration; and an average atomic concentration of dopants of the second conductivity type in the drift-region well 22 may be less than the third average distal atomic concentration. In one embodiment of the field effect transistor, the first portion of the shallow trench isolation structure 12 may be laterally spaced from a p-n junction between the source-side doped well 23 and the drift-region well 22 by a gate-drain overlap distance L_gdov; the first portion of the shallow trench isolation structure 12 has a shallow trench isolation thickness t_STI; and a ratio of the gate-drain overlap distance L_gdov to the shallow trench isolation thickness t_STI may be in a range from 2.5 to 1,000.

According to another aspect of the present disclosure, a field effect transistor is provided, which comprises: a semiconductor material layer 6 including a source-side doped well 23 having a doping of a first conductivity type, a drift-region well 22 having a doping of a second conductivity type that is an opposite of the first conductivity type, a source region 32 having a doping of the second conductivity type and embedded in the source-side doped well 23, and a drain region 38 having a doping of the second conductivity type and embedded in the drift-region well 22; a shallow trench isolation structure 12 comprising a first portion 12A overlying the drift-region well 22 and laterally spaced from the source-side doped well 23; a gate dielectric layer 50 laterally extending between a top surface of the source-side doped well 23 and the first portion 12A of the shallow trench isolation structure 12; and a gate electrode 54 overlying the gate dielectric layer 50, wherein: the first portion 12A of the shallow trench isolation structure 12 is laterally spaced from a p-n junction between the source-side doped well 23 and the drift-region well 22 by a gate-drain overlap distance L_gdov; the first portion 12A of the shallow trench isolation structure 12 has a shallow trench isolation thickness t_STI; and a ratio of the gate-drain overlap distance L_gdov to the shallow trench isolation thickness t_STI is in a range from 3 to 100.

In one embodiment, the field effect transistor may also include a proximal doped layer stack 24 embedded within the drift-region well 22 and interposed between the source-side doped well 23 and the first portion of the shallow trench isolation structure 12 and comprising a set of proximal doped semiconductor layers, wherein the proximal doped layer stack 24 has a variable atomic concentration profile as a function of a depth from a top surface of the semiconductor material layer. In one embodiment of the field effect transistor, the variable atomic concentration profile may have a peak atomic concentration for the dopants of the second conductivity type at a depth that is greater than a thickness of the first portion of the shallow trench isolation structure 12. In one embodiment of the field effect transistor, the set of proximal doped semiconductor layers comprise, from top to bottom, a first proximal doped semiconductor layer 242 including atoms of the dopants of the second conductivity type at a first average proximal atomic concentration, a second proximal doped semiconductor layer 244 including atoms of the dopants of the second conductivity type at a second average proximal atomic concentration, and a third proximal doped semiconductor layer 246 including atoms of the dopants of the second conductivity type at a third average proximal atomic concentration; and the third average proximal atomic concentration is greater than the second average proximal atomic concentration. In one embodiment, the field effect transistor may also include a distal doped layer stack 26 embedded within the drift-region well 22, underlying the first portion of the shallow trench isolation structure 12, interposed between the proximal doped layer stack 24 and the drain region 38, and comprising a set of distal doped semiconductor layers 26, wherein the distal doped layer stack has an additional variable atomic concentration profile as a function of a depth from a bottom surface of the first portion of the shallow trench isolation structure 12; and the variable atomic concentration profile has a peak atomic concentration for the additional dopants of the second conductivity type at a depth that is located above a horizontal plane including a bottommost surface of the proximal doped layer stack 24.

According to yet another aspect of the present disclosure, a field effect transistor is provided, which comprises: a semiconductor material layer 6 including a source-side doped well 23 having a doping of a first conductivity type, a drift-region well 22 having a doping of a second conductivity type that is an opposite of the first conductivity type, a source region 32 having a doping of the second conductivity type and embedded in the source-side doped well 23, a drain region 38 having a doping of the second conductivity type and embedded in the drift-region well 22; a shallow trench isolation structure 12 comprising a first portion 12A overlying the drift-region well 22 and laterally spaced from the source-side doped well 23; a gate dielectric layer 50 laterally extending between a top surface of the source-side doped well 23 and the first portion 12A of the shallow trench isolation structure 12; a gate electrode 54 overlying the gate dielectric layer 50; and a proximal doped layer stack 24 embedded within the drift-region well 22 and interposed between the source-side doped well 23 and the first portion 12A of the shallow trench isolation structure 12 and comprising a set of proximal doped semiconductor layers (242, 244, 246), wherein: the proximal doped layer stack 24 has a first variable atomic concentration profile as a function of a depth from a top surface of the semiconductor material layer 6; and the first variable atomic concentration profile has a peak atomic concentration ppac for the dopants of the second conductivity type at a depth that is greater than a thickness of the first portion 12A of the shallow trench isolation structure 12.

In one embodiment of the field effect transistor, the set of proximal doped semiconductor layers 24 may include, from top to bottom, a first proximal doped semiconductor layer 242 including atoms of the dopants of the second conductivity type at a first average proximal atomic concentration, a second proximal doped semiconductor layer 244 including atoms of the dopants of the second conductivity type at a second average proximal atomic concentration, and a third proximal doped semiconductor layer 246 including atoms of the dopants of the second conductivity type at a third average proximal atomic concentration; and the third average proximal atomic concentration may be greater than the second average proximal atomic concentration. In one embodiment of the field effect transistor, the first variable atomic concentration profile may have a first local minimum LM1' at an interface between the first proximal doped semiconductor layer 242 and the second proximal doped semiconductor layer 244; and the first variable atomic concentration profile has a second local minimum LM2' at an interface between the second proximal doped semiconductor layer 244 and the third proximal doped semiconductor layer 246. In one embodiment, the field effect transistor may also include a distal doped layer stack 26 embedded within the drift-region well 22, underlying the first portion of the shallow trench isolation structure 12, interposed between the proximal doped layer stack 24 and the drain region 38, and comprising a set of distal doped semiconductor layers (262, 264, 266), wherein: the distal doped layer stack 26 has a second variable atomic concentration profile as a function of a depth from a bottom surface of the first portion of the shallow trench isolation structure 12; and the second variable atomic concentration profile has a peak atomic concentration for the additional dopants of the second conductivity type at a depth that is located above a horizontal plane including a bottommost surface of the proximal doped layer stack 24. In one embodiment of the field effect transistor, the set of distal doped semiconductor layers 26 may include, from top to bottom, a first distal doped semiconductor layer 262 including atoms of the additional dopants of the second conductivity type at a first average distal atomic concentration, a second distal doped semiconductor layer 264 including atoms of the additional dopants of the second conductivity type at a second average distal atomic concentration, and a third distal doped semiconductor layer 266 including atoms of the additional dopants of the second conductivity type at a third average distal atomic concentration; the second variable atomic concentration profile has a first local minimum LM1 at an interface between the first distal doped semiconductor layer 262 and the second distal doped semiconductor layer 264; and the second variable atomic concentration profile has a second local minimum LM2 at an interface between the second distal doped semiconductor layer 264 and the third distal doped semiconductor layer 266.

The various embodiments of the present disclosure may be used to provide a field effect transistor suitable for a high voltage operation without degradation, or with reduced degradation over time, due to hot carrier injection. The path of the electrical current is engineered through selection of the ratio of the gate-drain overlap distance L_gdov to the shallow trench isolation thickness t_STI within a preferred range, and/or use of the proximal doped layer stack 24 that induces the channel current away from a bottom corner of a shallow trench isolation structure 12, and/or use of the distal doped layer stack 26 that maintains the channel current below, and away from, the bottom surface of the shallow trench isolation structure 12. Thus, a high voltage transistor that eliminates, and/or reduces, degradation of device characteristic over time may be provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor comprising:
a semiconductor material layer including a source-side doped well having a doping of a first conductivity type, a drift-region well having a doping of a second conductivity type that is an opposite of the first conductivity type, a source region having a doping of the second conductivity type and embedded in the source-side doped well, a drain region having a doping of the second conductivity type and embedded in the drift-region well;
a shallow trench isolation structure comprising a first portion overlying the drift-region well and laterally spaced from the source-side doped well;
a gate dielectric layer laterally extending between a top surface of the source-side doped well and the first portion of the shallow trench isolation structure;
a gate electrode overlying the gate dielectric layer; and
a proximal doped layer stack embedded within the drift-region well and interposed between the source-side doped well and the first portion of the shallow trench isolation structure and comprising a set of proximal doped semiconductor layers, wherein each of the set of proximal doped semiconductor layers has different average atomic concentrations of dopants of the second conductivity type.

2. The field effect transistor of claim 1, wherein:
the proximal doped layer stack has a variable atomic concentration profile as a function of a depth from a top surface of the semiconductor material layer; and
the variable atomic concentration profile has a peak atomic concentration for the dopants of the second conductivity type at a depth that is greater than a thickness of the first portion of the shallow trench isolation structure.

3. The field effect transistor of claim 1, wherein:
the set of proximal doped semiconductor layers comprise, from top to bottom, a first proximal doped semiconductor layer including atoms of the dopants of the second conductivity type at a first average proximal atomic concentration, a second proximal doped semiconductor layer including atoms of the dopants of the second conductivity type at a second average proximal atomic concentration, and a third proximal doped semiconductor layer including atoms of the dopants of the second conductivity type at a third average proximal atomic concentration; and
the third average proximal atomic concentration is greater than the second average proximal atomic concentration.

4. The field effect transistor of claim 3, wherein:
the second average proximal atomic concentration is greater than the first average proximal atomic concentration; and
an average atomic concentration of dopants of the second conductivity type in the drift-region well is less than the first average proximal atomic concentration.

5. The field effect transistor of claim 3, wherein the first proximal doped semiconductor layer contacts a bottom surface of the gate dielectric layer, and is laterally spaced from a p-n junction between the source-side doped well and the drift-region well.

6. The field effect transistor of claim 1, further comprising a distal doped layer stack embedded within the drift-region well, underlying the first portion of the shallow trench isolation structure, interposed between the proximal doped layer stack and the drain region, and comprising a set of distal doped semiconductor layers, wherein the set of distal doped semiconductor layers have different average atomic concentrations of additional dopants of the second conductivity type.

7. The field effect transistor of claim 6, wherein:

the distal doped layer stack has a variable atomic concentration profile as a function of a depth from a bottom surface of the first portion of the shallow trench isolation structure; and the variable atomic concentration profile has a peak atomic concentration for the additional dopants of the second conductivity type at a depth that is located above a horizontal plane including a bottommost surface of the proximal doped layer stack.

8. The field effect transistor of claim 6, wherein:

the set of distal doped semiconductor layers comprise, from top to bottom, a first distal doped semiconductor layer including atoms of the additional dopants of the second conductivity type at a first average distal atomic concentration, a second distal doped semiconductor layer including atoms of the additional dopants of the second conductivity type at a second average distal atomic concentration, and a third distal doped semiconductor layer including atoms of the additional dopants of the second conductivity type at a third average distal atomic concentration; and the second average distal atomic concentration is greater than the first average distal atomic concentration.

9. The field effect transistor of claim 8, wherein:

the second average distal atomic concentration is greater than the third average distal atomic concentration; and an average atomic concentration of dopants of the second conductivity type in the drift-region well is less than the third average distal atomic concentration.

10. The field effect transistor of claim 1, wherein:

the first portion of the shallow trench isolation structure is laterally spaced from a p-n junction between the source-side doped well and the drift-region well by a gate-drain overlap distance;

the first portion of the shallow trench isolation structure has a shallow trench isolation thickness; and a ratio of the gate-drain overlap distance to the shallow trench isolation thickness is in a range from 2.5 to 1,000.

11. A field effect transistor comprising:

a semiconductor material layer including a source-side doped well having a doping of a first conductivity type, a drift-region well having a doping of a second conductivity type that is an opposite of the first conductivity type, a source region having a doping of the second conductivity type and embedded in the source-side doped well, and a drain region having a doping of the second conductivity type and embedded in the drift-region well;

a shallow trench isolation structure comprising a first portion overlying the drift-region well and laterally spaced from the source-side doped well;

a gate dielectric layer laterally extending between a top surface of the source-side doped well and the first portion of the shallow trench isolation structure; and a gate electrode overlying the gate dielectric layer, wherein:

the first portion of the shallow trench isolation structure is laterally spaced from a p-n junction between the source-side doped well and the drift-region well by a gate-drain overlap distance;

the first portion of the shallow trench isolation structure has a shallow trench isolation thickness; and a ratio of the gate-drain overlap distance to the shallow trench isolation thickness is in a range from 3 to 100.

12. The field effect transistor of claim 11, further comprising a proximal doped layer stack embedded within the drift-region well and interposed between the source-side doped well and the first portion of the shallow trench isolation structure and comprising a set of proximal doped semiconductor layers, wherein the proximal doped layer stack has a variable atomic concentration profile as a function of a depth from a top surface of the semiconductor material layer.

13. The field effect transistor of claim 12, wherein the variable atomic concentration profile has a peak atomic concentration for dopants of the second conductivity type at a depth that is greater than a thickness of the first portion of the shallow trench isolation structure.

14. The field effect transistor of claim 12, wherein:

the set of proximal doped semiconductor layers comprise, from top to bottom, a first proximal doped semiconductor layer including atoms of dopants of the second conductivity type at a first average proximal atomic concentration, a second proximal doped semiconductor layer including atoms of the dopants of the second conductivity type at a second average proximal atomic concentration, and a third proximal doped semiconductor layer including atoms of the dopants of the second conductivity type at a third average proximal atomic concentration; and the third average proximal atomic concentration is greater than the second average proximal atomic concentration.

15. The field effect transistor of claim 12, further comprising a distal doped layer stack embedded within the drift-region well, underlying the first portion of the shallow trench isolation structure, interposed between the proximal doped layer stack and the drain region, and comprising a set of distal doped semiconductor layers, wherein the distal doped layer stack has an additional variable atomic concentration profile as a function of a depth from a bottom surface of the first portion of the shallow trench isolation structure; and the additional variable atomic concentration profile has a peak atomic concentration for additional dopants of the second conductivity type at a depth that is located above a horizontal plane including a bottommost surface of the proximal doped layer stack.

16. A field effect transistor comprising:

a semiconductor material layer located over a buried insulating layer and comprising a source-side doped well of a first conductivity type, a drift-region well of a second conductivity type that is opposite to the first conductivity type, a source region of the second conductivity type embedded in the source-side doped well, and a drain region of the second conductivity type embedded in the drift-region well;

a shallow trench isolation structure having a first portion that overlies a part of the drift-region well and that is laterally separated from the source-side doped well by a gate-drain overlap distance;

a gate dielectric layer extending laterally from a top surface of the source-side doped well to the first portion of the shallow trench isolation structure;

a gate electrode located on the gate dielectric layer; and a proximal doped layer stack located entirely within the drift-region well between the source-side doped well and the first portion of the shallow trench isolation structure, the proximal doped layer stack comprising a plurality of vertically stacked proximal doped semiconductor layers having mutually different average doping concentrations of the second conductivity type.

17. The field effect transistor of claim 16, wherein:

the proximal doped layer stack exhibits a first vertical dopant concentration profile of the second conductivity type that varies with depth from a top surface of the semiconductor material layer, and the first vertical dopant concentration profile has a peak dopant concentration located at a depth that is greater than a thickness of the first portion of the shallow trench isolation structure, thereby deflecting operating current downward and away from a bottom corner of the shallow trench isolation structure.

18. The field effect transistor of claim 17, wherein the first vertical dopant concentration profile of the proximal doped layer stack comprises, from top to bottom:

a first proximal doped semiconductor layer having a first average concentration, a second proximal doped semiconductor layer having a second average concentration higher than the first average concentration, and a third proximal doped semiconductor layer having a third average concentration higher than the second average concentration, the first vertical dopant concentration profile thereby exhibiting at least two local minima located respectively at interfaces between the first and second proximal doped semiconductor layers and between the second and third proximal doped semiconductor layers.

19. The field effect transistor of claim 16, further comprising a distal doped layer stack located entirely within the drift-region well underneath the first portion of the shallow trench isolation structure and between the proximal doped layer stack and the drain region, wherein:

the distal doped layer stack comprises a plurality of vertically stacked distal doped semiconductor layers having mutually different average doping concentrations of the second conductivity type; and a second vertical dopant concentration profile of the second conductivity type in the distal doped layer stack, measured downward from a bottom surface of the first portion of the shallow trench isolation structure, has its peak dopant concentration located above a horizontal plane that contains a bottommost surface of the proximal doped layer stack.

20. The field effect transistor of claim 16, wherein:

the first portion of the shallow trench isolation structure is laterally spaced from a p-n junction between the source-side doped well and the drift-region well by the gate-drain overlap distance;

the first portion of the shallow trench isolation structure has a shallow trench isolation thickness; and a ratio of the gate-drain overlap distance to the shallow trench isolation thickness is greater than 3 and less than 100, thereby causing more than 99% of on-state current to flow beneath the bottom corner of the first portion of the shallow trench isolation structure.

* * * * *